United States Patent [19]

Otsuji et al.

[11] Patent Number: 4,928,278
[45] Date of Patent: May 22, 1990

[54] IC TEST SYSTEM

[75] Inventors: Taiichi Otsuji, Ebina; Naoaki Narumi, Isehara, both of Japan

[73] Assignee: Nippon Telegraph and Telephone Corporation, Tokyo, Japan

[21] Appl. No.: 229,780

[22] Filed: Aug. 5, 1988

[30] Foreign Application Priority Data

Aug. 10, 1987 [JP] Japan ............................. 62-198247
Sep. 22, 1987 [JP] Japan ............................. 62-237981

[51] Int. Cl.$^5$ ........................................... G01R 31/28
[52] U.S. Cl. ................................... 371/1; 364/571.01;
364/579; 371/25.1; 371/27; 371/22.3
[58] Field of Search ...................... 371/15, 25, 27, 1;
324/73 AT; 364/579, 580, 571.01

[56] References Cited

U.S. PATENT DOCUMENTS 4,517,661  5/1985  Graf et al. ........................... 364/900
4,806,852  2/1989  Swan et al. ........................ 324/73 R
4,827,437  5/1989  Blanton ............................. 364/571.01

OTHER PUBLICATIONS

Milne, B., "Timing, Not Speed, Counts the Most when Testing Fast VLSI ICs", Electronic Design, May 29, 1986, pp. 132–142.
Ichimiya et al., "Effective Test Pattern Generation for High Speed Logic LSI Testing," 1979 IEEE Test Conference, pp. 377–381.
Sugamori et al., "Analysis and Definition of Overall Timing Accuracy in VLSI Test System", 1981 IEEE Test Conference, pp. 143–153.
Skala, "Continual Autocalibration for High Timing Accuracy", 1980 IEEE Test Conference, pp. 111–116.
Deerr, "Automatic Calibration for a VLSI Test System", 1983 International Test Conference, pp. 181–187.
Grasso et al., "A 250 MHz Test System's Timing and Automatic Calibration", 1987 International Test Conference, pp. 76–84.

Primary Examiner—Jerry Smith
Assistant Examiner—Stephen M. Baker
Attorney, Agent, or Firm—Spencer & Frank

[57] ABSTRACT

Calibration of timing errors of each pin electronics unit is carried out by a main controller and a plurality of controllers, each assigned to each pin electronics unit or to each block including a plurality of pin electronics units. A reference timing signal is simultaneously distributed to each pin electronics unit or block, so that the timing error calibration is executed in parallel among the pin electronics units or the blocks.

26 Claims, 13 Drawing Sheets

IC TEST SYSTEM

BACKGROUND OF THE INVENTION

1. Field of the Invention

The present invention relates to an IC test system for testing various functions of IC devices and more particularly to an IC test system for automatically calibrating timing errors occurred when a plurality of test signal pattern outputs or the outputs from an IC device under test are judged.

2. Description of the Prior Art

With the advancement of semiconductor integrated circuit technology, the tendency toward a higher density and a higher operation speed of an IC device has been accelerated, so that there have been increasing demands for IC test systems capable of increasing not only the number of pins of IC devices under test but also the test speed. At present, an IC test system which has 512 test pins and a test speed of the order of 100 MHz is available on the market. With the advancement of the operation speed of devices, there have been strong demands for the improvement of not only the test speed but also the test timing accuracy.

In general, an IC test system has hardware or pin electronics as one unit which has the capability of supplying a test signal pattern to each test pin and analyzing and judging the output results from an IC device under test. In order to define the rise and fall timing of a signal waveform in the case of the generation of a test signal pattern, two or four independent timing signals are required and furthermore a timing signal for defining a judging timing is also needed in a comparator which judges the output results from the IC device under test.

Pin electronics units which are assigned to individual test pins vary in characteristics from each other and the variations in power supply and ambient temperature result in time errors of the timing signals in respective pin electronics units. More particularly, the test pattern supply timing or the test result judging timing varies from one pin electronics unit to another. It follows, therefore, that, in order to realize a high degree of test accuracy, timing errors must be calibrated prior to IC tests.

In a conventional IC test system, a main controller with capability equivalent to that of a mini-computer controls the whole IC test system including a group of pin electronics units and the calibration of a timing error of the type described above is executed in series pin by pin. That is, a reference timing signal generator is provided as a time reference in the case of the timing error calibration and is connected to one pin electronics unit to be calibrated by sequentially switching such a pin electronics unit to execute the calibration in series pin by pin. For instance, a typical reference is made to "CONTINUAL AUTOCALIBRATION FOR HIGH TIMING ACCURACY", Ken Skala, Proc. IEEE Int'l Test Conference, pp. 111-116, November 1980 and especially to pp. 115-116 and FIG. 6.

The number of timing signals to be calibrated is in proportion to the number of timing signals applied to each pin and the number of test pins. For instance, in the case of a commercially available multi-pin tester (256 pins), the number of timing signals to be calibrated is in excess of 1000. With the increase in the number of test pins, the time required for executing a timing error calibration is increased and, for instance, when there exist 512 pins, it takes from 10 to 30 minutes to accomplish the calibration processing.

As described above, in the conventional IC test system, timing error calibration is executed only in series pin by pin and it takes a long time to complete the calibration for all the pins. This serial test processing causes a serious problem when it is required to improve the test efficiency in addition to the increased number of test pins. In addition to the problem that the time required for timing error calibration is increased in proportion to the increase in the number of test pins, the improvement of the test speed inevitably needs a high degree of accuracy and therefore a longer time is required for executing the timing error calibration more accurately.

SUMMARY OF THE INVENTION

In view of the above state of the art and the requirements, the present invention was made to solve the above and other problems encountered in the conventional IC test system, and it is an object of the present invention to provide an IC test system capable of shortening a time required for the timing calibration.

It is another object of the present invention to provide an IC test system for executing the timing calibration of all the pin electronics units in parallel, so that the time required for timing calibration is not increased, even if the number of test pins is increased.

In the first aspect of the present invention, an IC test system for testing an IC device by supplying a test signal pattern to the IC device through the input/output pins of the IC device and by receiving output signals from the IC device through the input/output pins, comprises:

(A) clock means for generating clocks;

(B) a main controller for controlling the IC test system;

(C) a plurality of pin electronics units, each of which is assigned to each of the input/output pins, each pin electronics unit having;

(C1) timing signal generating means for generating, in response to the clocks from the clock means, first timing signals for providing timings for supplying the test signal pattern to the IC device and a second timing signal for providing a timing for judging test result of the IC device;

(C2) pattern generating means for generating the test signal pattern in accordance with the timings defined by the first timing signals;

(C3) test result judging means receiving the test signal pattern and responses of the IC device to the test signal pattern and for judging the result of the responses at the timing of the second timing signal; and (C4) a controller for cooperating with the timing signal generating means, the pattern generating means and the test result judging means to measure errors of the first and second timing signals and an error of the length of a line between each pin electronics unit and its corresponding input/output and for performing arithmetic operations of and controls of calibration of the errors;

(D) reference timing signal generating means receiving the clock from the clock means and for generating a reference timing signal which defines a time reference when measuring the errors; and (E) distributing means for simultaneously distributing, in the case of the calibration of the errors, the reference timing signal to the test result judging means of all the pin electronics units or to the test result judging means of all the pin electronics units and the input/output pins corresponding to respective ones of the plurality of pin electronics units; the main controller controlling the clock means, the controller in each of the plurality of pin electronics units and the reference timing signal generating means to execute the calibration of the errors for the plurality of pin electronics units in parallel among the plurality of pin electronics units.

Here, the pattern generating means may include a pattern generation circuit for storing therein pattern data for designating mode and level of the test signal pattern and a waveform formatter circuit receiving the first timing signals and the pattern data and for generating the test signal pattern.

The test result judging means may include a comparator for comparing the test signal pattern and the response to the test signal pattern with a comparison reference level at a timing of the second timing signal and a storage circuit for storing comparison results from the comparator.

The distributing means may comprise a plurality of one-input/multi-output OR logic gates connected in the form of tree.

Each of the pin electronics units may include a first switch having one terminal connected to the distributing means, a second switch having one terminal connected to the test result judging means and a third switch having one terminal connected to each of the input/output pins and the other terminals of the first, second and third switches may be connected in common.

The pattern generating means may include a driver circuit for supplying the test signal pattern to the test result judging means.

In the second aspect of the present invention, an IC test system for testing an IC device by supplying a test signal pattern to the IC device through the input/output pins of the IC device and by receiving output signals from the IC device through the input/output pins, comprises:

(A) clock means for generating clocks;

(B) a main controller for controlling the IC test system;

(C) a plurality of pin electronics units, each of which is assigned to each of the input/output pins, each pin electronics unit having;

(C1) timing signal generating means for generating, in response to the clocks from the clock means, first timing signals for providing timings for supplying the test signal pattern to the IC device and a second timing signal for providing a timing for judging test result of the IC device;

(C2) pattern generating means for generating the test signal pattern in accordance with the timings defined by the first timing signals; and (C3) test result judging means receiving the test signal pattern and responses of the IC device to the test signal pattern and for judging the result of the responses at the timing of the second timing signal;

(D) a plurality of controllers, each assigned to each one of a plurality of blocks, each of which has a plurality of pin electronics units and for cooperating with the main controller, the timing signal generating means, the pattern generating means and the test result judging means to measure errors of the first and second timing signals and an error of the length of a line between each pin electronics unit and its corresponding input/output pin and for performing arithmetic operations of and controls of calibration of the errors;

(E) reference timing signal generating means receiving the clocks from the clock means and for generating a reference timing signal which defines a time reference when measuring the errors; and (F) distributing means for simultaneously distributing, in the case of the calibration of the errors, the reference timing signal to the test result judging means of all the pin electronics units in the plurality of blocks or to the test result judging means of all the pin electronics units in the plurality of blocks and the input/output pins corresponding to respective ones of the plurality of blocks; the main controller controlling the clock means, the plurality of controllers and the reference timing signal generating means to execute the calibration of the errors for the plurality of pin electronics units in series with respect to the plurality of pin electronics units in each block and in parallel among the plurality of blocks.

Here, the distributing means may include first distributing means provided in common to all of the plurality of blocks and a plurality of second distributing means, each provided in common to the plurality of pin electronics units in each of the plurality of blocks.

Each of the first and second distributing means may include a plurality of one-input/multi-output OR logic gates connected in the form of tree.

In the third aspect of the present invention, an IC test system for testing an IC device by supplying a test signal pattern to the IC device through the input/output pins of the IC device and by receiving output signals from the IC device through the input/output pins, comprises:

(A) clock means for generating clocks;

(B) a main controller for controlling the IC test system;

(C) a plurality of timing generating means, each assigned to each of the input/output pins, and each responsive to the clocks from the clock means for generating first timing signals for providing timings for supplying the test signal pattern to the IC device and a second timing signal for providing a timing for judging test result of the IC device;

(D) a plurality of pattern generating means, each assigned to each of the input/output pins, and each for generating the test signal pattern in accordance with the timings defined by the first timing signals;

(E) a plurality of test result judging means, each assigned to each of the input/output pins, and each responsive to the test signal pattern and to responses of the IC device to the test signal pattern for judging the result of the responses at the timing of the second timing signal;

(F) a plurality of controllers, each cooperating with the main controller, the timing signal generating means, the pattern generating means and the test result judging means to measure errors of the first and second timing signals and an error of the length of a line between the IC test system and each of the input/output pins for performing arithmetic operations of and controls of the calibration of the errors;

(G) reference timing signal generating means receiving the clocks from the clock means and for generating a reference timing signal which defines a time reference when measuring the errors; and (H) distributing means for simultaneously distributing, in the case of the calibration of the errors, the reference timing signal to the plurality of test result judging means or to the plurality of test result judging means and all of the input/output pins; the main controller controlling the clock means, the plurality of controllers and the reference timing signal generating means to execute the calibration of the errors in parallel among the plurality of controllers.

In the fourth aspect of the present invention, an IC test system for testing an IC device by supplying a test signal pattern to the IC device through the input/output pins of the IC device and by receiving output signals from the IC device through the input/output pins, comprises:

(A) clock means for generating clocks;

(B) a main controller for controlling the IC test system;

(C) common timing signal generating means for generating a common timing signal in response to the clock from the clock means;

(D) a plurality of timing adjusting means, each assigned to each of the input/output pins, and for adjusting timing of the common timing signal to generate first timing signals for providing timings for supplying the test signal pattern to the IC device and a second timing signal for providing a timing for judging test result of the IC device;

(E) a plurality of pattern generating means, each assigned to each of the input/output pins, and for generating the test signal pattern in accordance with the timings defined by the first timing signals;

(F) a plurality of test result judging means, each assigned to each of the input/output pins, and each responsive to the test signal pattern and to responses of the IC device to the test signal pattern for judging the result of the responses at the timing of the second timing signal;

(G) a plurality of controllers, each for cooperating with the main controller, the timing signal adjusting means, the pattern generating means and the test result judging means to measure errors of the first and second timing signals and an error of the length of a line between the IC test system and each of the input/output pins for performing arithmetic operations of and controls of the calibration of the errors;

(H) reference timing signal generating means receiving the clocks from the clock means and for generating a reference timing signal which defines a time reference when measuring the errors; and (I) distributing means for simultaneously distributing, in the case of the calibration of the errors, the reference timing signal to the plurality of test result judging means or to the plurality of test result judging means and all of the input/output pins; the main controller controlling the clock means, the common timing signal generating means, the plurality of controllers and the reference timing signal generating means to execute the calibration of the errors in parallel among the plurality of controllers.

According to the present invention, each pin electronics unit has a controller for measuring errors of the timing of supplying a test pattern to each pin electronics unit and the timing of judging the test result and for performing arithmetic operations and controls concerning error calibrations for the timings. The controller mounted on each pin electronics unit is controlled by a main controller, so that the timing error calibration can be accomplished in parallel for all the pin electronics units simultaneously.

In the IC test system in accordance with the present invention, the output signal from the reference timing signal generator for providing a time reference for timing calibration is simultaneously distributed and supplied to all the pin electronics units. The controller arranged in each pin electronics unit executes the measurement of the respective timing errors for the respective pin electronics unit and the arithmetic operations and controls concerning the calibrations of the timing errors for the respective pin electronics units in parallel. As a result, timing errors of the comparators arranged in the respective pin electronics units for judging the output results from an IC device under test can be simultaneously calibrated for all the pin electronics units. After this timing calibration is accomplished in the manner described above, the comparators are activated in response to the timing signals thus calibrated in the manner described above for the respective pin electronics units under the continuous control by the group of the controllers, so that the output timing errors of the test signal patterns are simultaneously calibrated for all the pin electronics units. As a result, the timing error calibrations for the respective pin electronics units are executed in parallel, so that a time required for the entire timing error calibration processing is shortened to a fraction of the number of test pins, as compared with the time required for the conventional IC test system which executes a serial processing.

According to another aspect of the present invention, the output signal from the reference timing signal generator as a time reference for the timing calibration is simultaneously distributed and supplied to a plurality of pin electronics units and an independently operable controller is allotted to each of two or more groups of pin electronics units into which the plurality of pin electronics units are divided. The controller allotted to each block or group executes the measurement of timing errors and the arithmetic operations and controls concerning the error calibration for the pin electronics units in each block. By the construction described above, the supply of the reference timing signal to the pin electronics units and the storage of the results of the response from the pin electronics units can be accomplished in a completely parallel manner among the test pins. The processes executed by the controller such as the judgement of the results of the response, presetting of various conditions of the pin electronics units in accordance with the judged results are accomplished in parallel among the division blocks. Within one division block, the processes are executed in series by the controller, but the processing time can be reduced to less than a fraction of the number of division blocks as compared with the conventional IC test system in which all the processes for the timing calibration are executed in series. For instance, in the case of a tester with the total number of 256 pins and the operation rate of 100 MHz, when the pin electronics units are divided into blocks each having from 4 pin electronics units to 16 pin electronics units (the number of division being from 64 to 16), and furthermore when the number of transmitted bits of the reference timing pulse and the clock rate of the controller are assumed to be 10K-bits and 10 MHz, respectively, the processing time can be considerably shortened to 1/200-1/100 as compared with the conventional IC test system.

Further, an IC tester of the type in which a controller and a timing pulse generator are provided for each pin electronics unit is disclosed in U.S. Pat. No. 4,517,661

(issued May 14, 1985). In this patent, however, nothing is considered or disclosed about timing error calibration. In other words, this patent does not disclose at all the system in which a reference timing signal generator is provided in common for all the pin electronics units, so that parallel timing error calibration can be executed by simultaneously feeding the reference timing signal from the sole reference timing generator to the respective pin electronics units through a signal distributor.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 1:
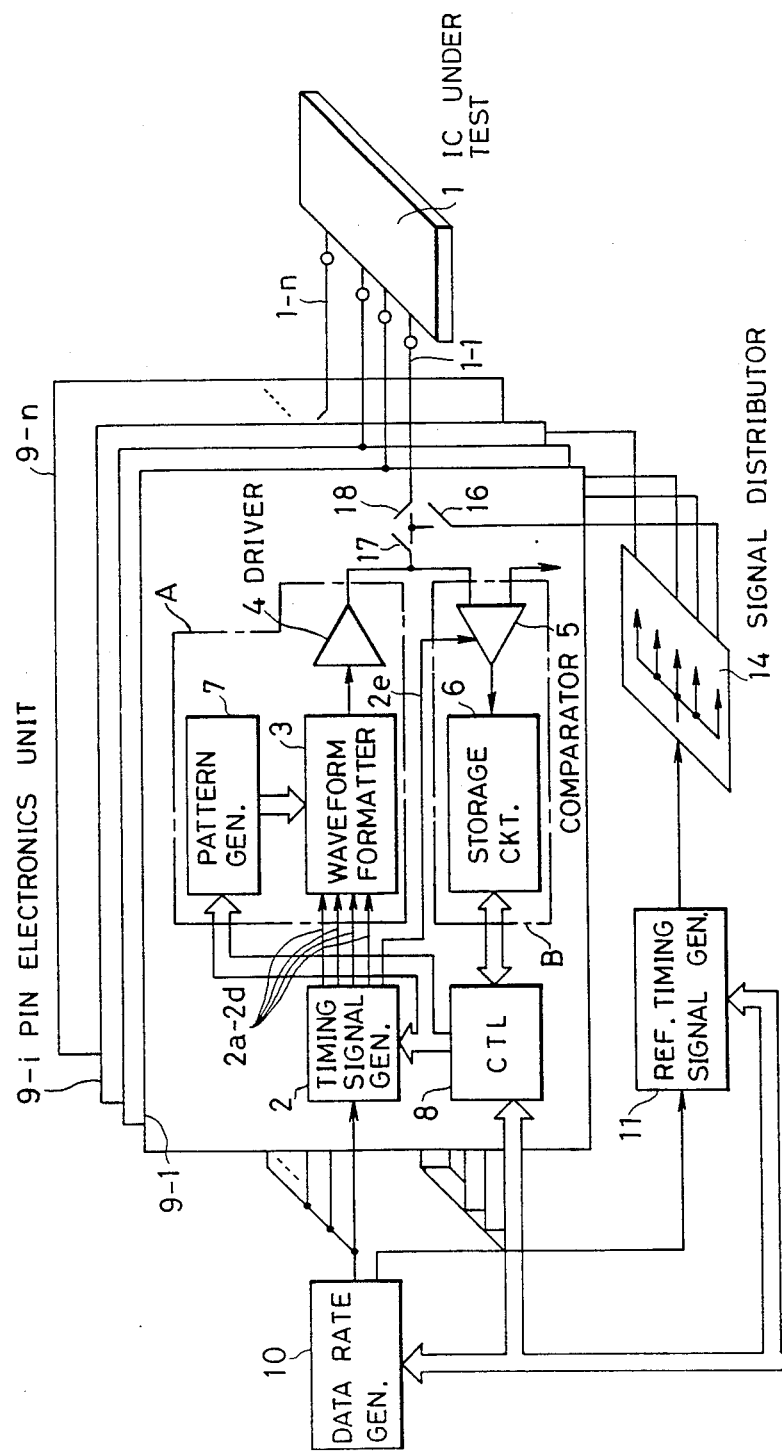
FIG. 1 is a block diagram showing an embodiment of an IC test system in accordance with the present invention.

FIG. 1 shows an embodiment of a timing system in an IC test system in accordance with the present invention. There are provided n pin electronics units 9-1, ..., 9-n corresponding to n input/output pins 1-1, ..., 1-n of an IC device 1 under test. Each pin electronics unit 9-i (i=1, ..., n) fundamentally comprises a test pattern supply circuit A having a waveform formatter circuit 3, a pattern generator 7 and a driver 4; a test result judging circuit B having a comparator 5 and a storage circuit 6 for storing therein the comparison results; a timing signal generator 2 for determining the operation timings of the test pattern supply circuit A and the test result judging circuit B, all of which constitute a test unit group; and a controller 8 for controlling the test unit group and executing the arithmetic operations thereof.

In order to calibrate timing errors in the case of the generation of a test signal pattern or the judgement of the test results from an IC device under test, a reference timing signal generator 11 for defining a time reference in the case of timing error calibration is provided in common for all the pin electronics units 9-1, ..., 9-n. The output from the reference timing signal generator 11 is simultaneously supplied through a switch 16 arranged in each pin electronics unit 9-i (i=1, 2, 3, ..., n) to a group of signal lines by a signal distributor 14, each extending from each pin electronics unit 9-i to its corresponding input/output pin 1-i (i=1, 2, 3, ..., n) of the IC device 1 under test through switches 17 and 18 arranged in each pin electronics unit 9-i.

A data rate generator 10 simultaneously distributes to the generators 2 and 11 the clock signal for defining the generation of the test signal pattern required for testing the IC device 1, the period for judging the resultant response from the IC device 1 under test and the period for activating the reference timing signal generator 11. A main controller 15 which controls the whole test system controls the controller 8 mounted in each pin electronics unit 9-i, the reference timing signal generator 11 and the date rate generator 10.

A test signal pattern is generated in a manner to be described in detail below. That is, the feed rate of the test signal pattern is determined by the clock frequency of the data rate generator 10, and the timing that the waveform of the test signal pattern starts to rise and the timing that the waveform starts to fall at each period of the test signal pattern are determined by timing edge signals 2a-2d preset in the timing pulse generator 2 and are used for wareform formatting. A mode and a level of the pattern in each period, such as a low level of RZ (Return to Zero) signal or a high level of NRZ (Non-Return to Zero) signal are determined by the pattern generator 7 and in accordance with the pattern designation output data from the pattern generator 7, a test signal pattern to be actually used is generated by the waveform formatter circuit 3 at the timings determined by the timing edge signals 2a-2d. The test signal pattern thus generated is fed from the driver 4 through the switches 17 and 18 to the input pin of the IC device 1 under test which is connected to the pin electronics unit 9-i.

The result of the response of the IC device 1 under test to the input of the test signal pattern is judged as follows. That is, an expected level of the result of the response of the IC device 1 under test is set at one input terminal of the comparator 5. In a simple manner, the expected level is set at the intermediate level of the expected output signal from the IC device 1 under test. The other input terminal of the comparator 5 is connected to the corresponding output pin of the IC device 1 under test through the switches 17 and 18. The signal levels of both the inputs are compared with each other at the output timing of the response-result judging timing edge signal 4e set in the timing pulse generator 2 and the result of the comparison is stored in the storage circuit 6.

Due to variations in characteristics of the respective test units, lengths of lines connecting the test units, an ambient temperature of the system, a power supply voltage, and so on, the test signal pattern output timing edge signals 2a-2d and the timing edge signal 2e by which the result of the response of the IC device 1 under test is judged vary from one pin to another. Calibration of errors of such varied timing edge signals 2a-2e can be realized by adjusting the above-described signals for defining the test operation timings; that is, the timing edge signals 2a-2e generated by the timing generator 2; with respect to one time reference.

Such timing error calibration is controlled both by the controller 8 provided for each pin electronics unit 9-i and by the main controller 15.

Figure 2:
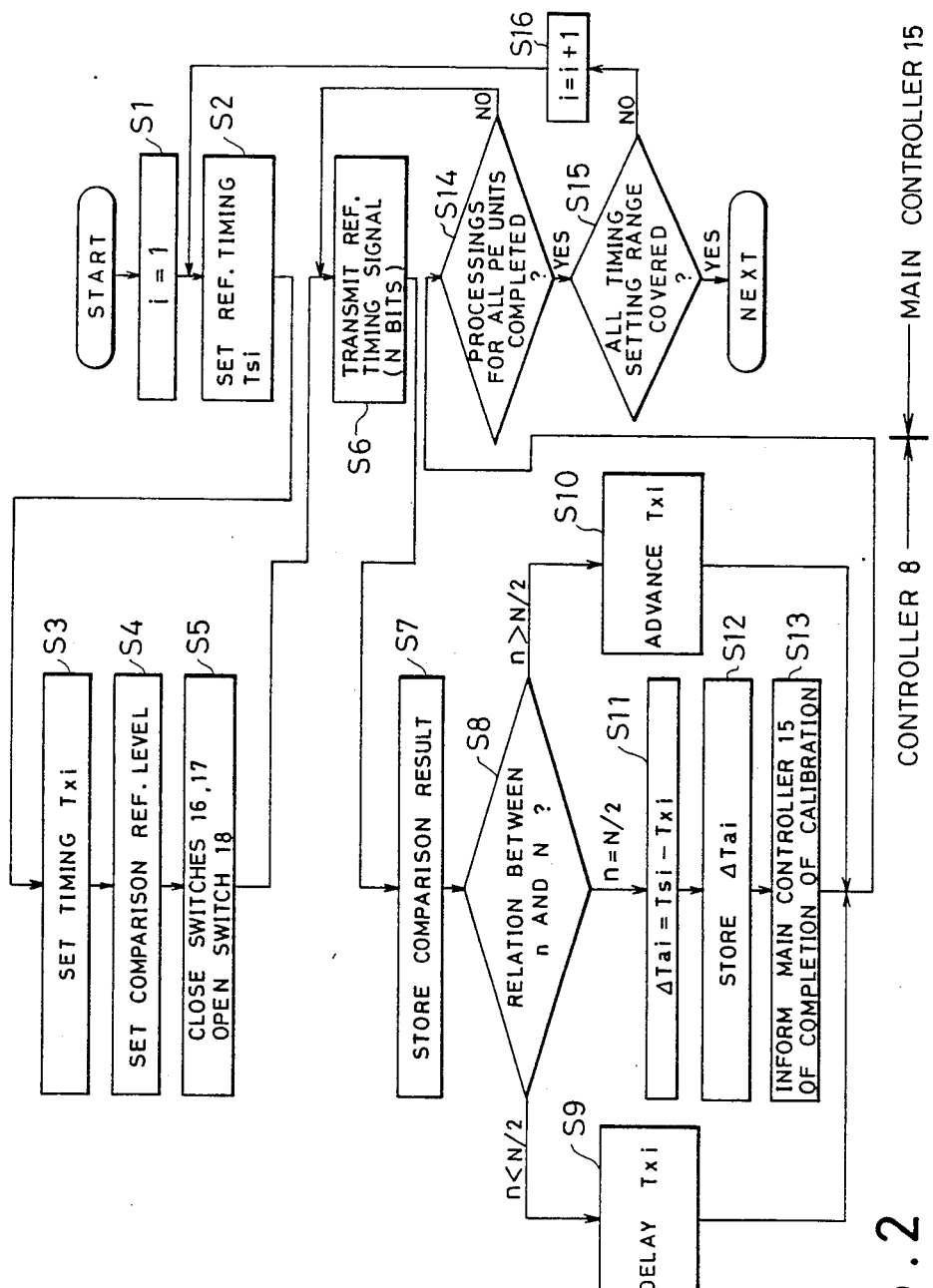
FIGS. 2, 3 and 4 are flowcharts illustrating examples of the control procedures thereof.
Figure 3:
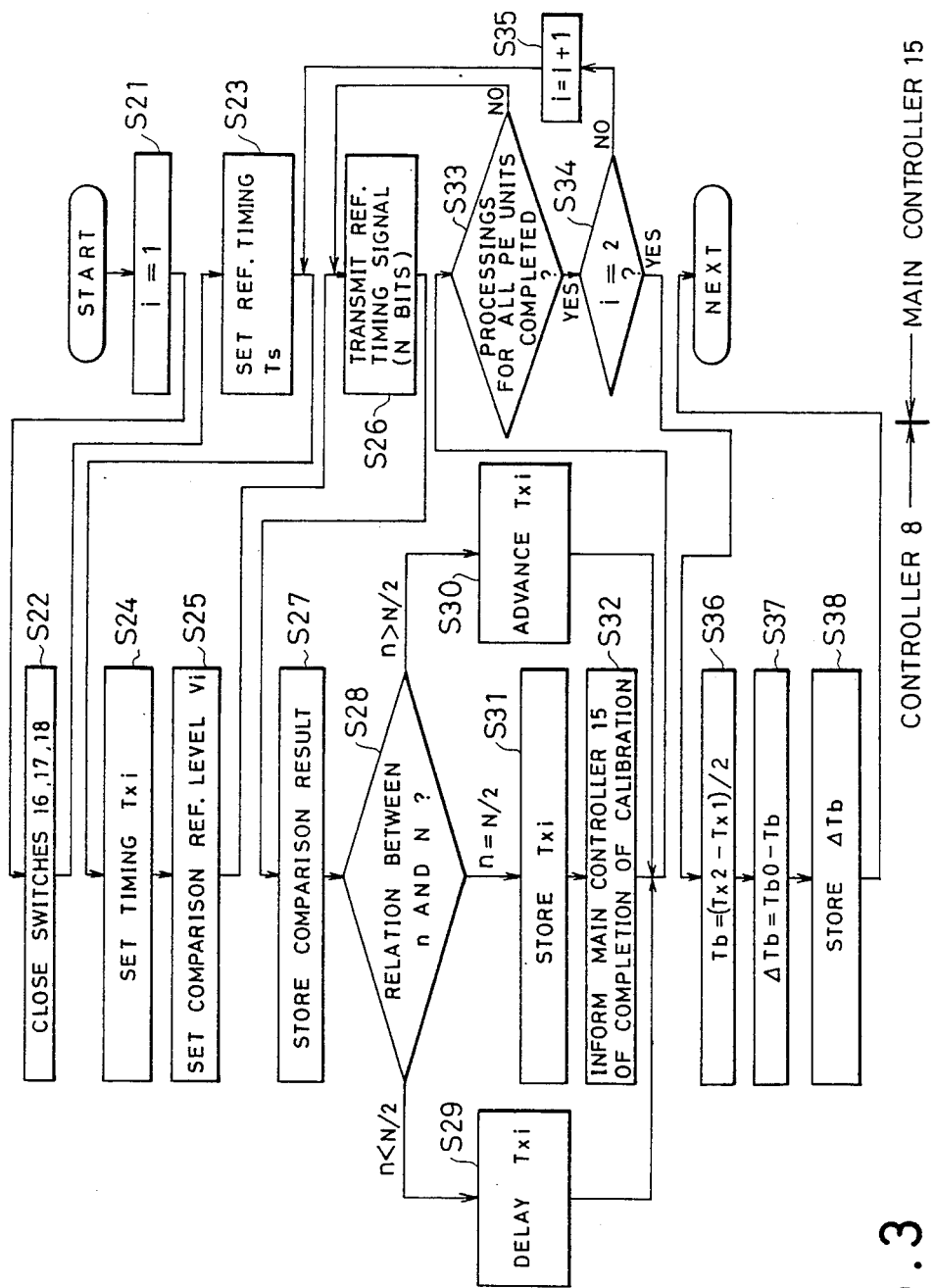
Figure 4:
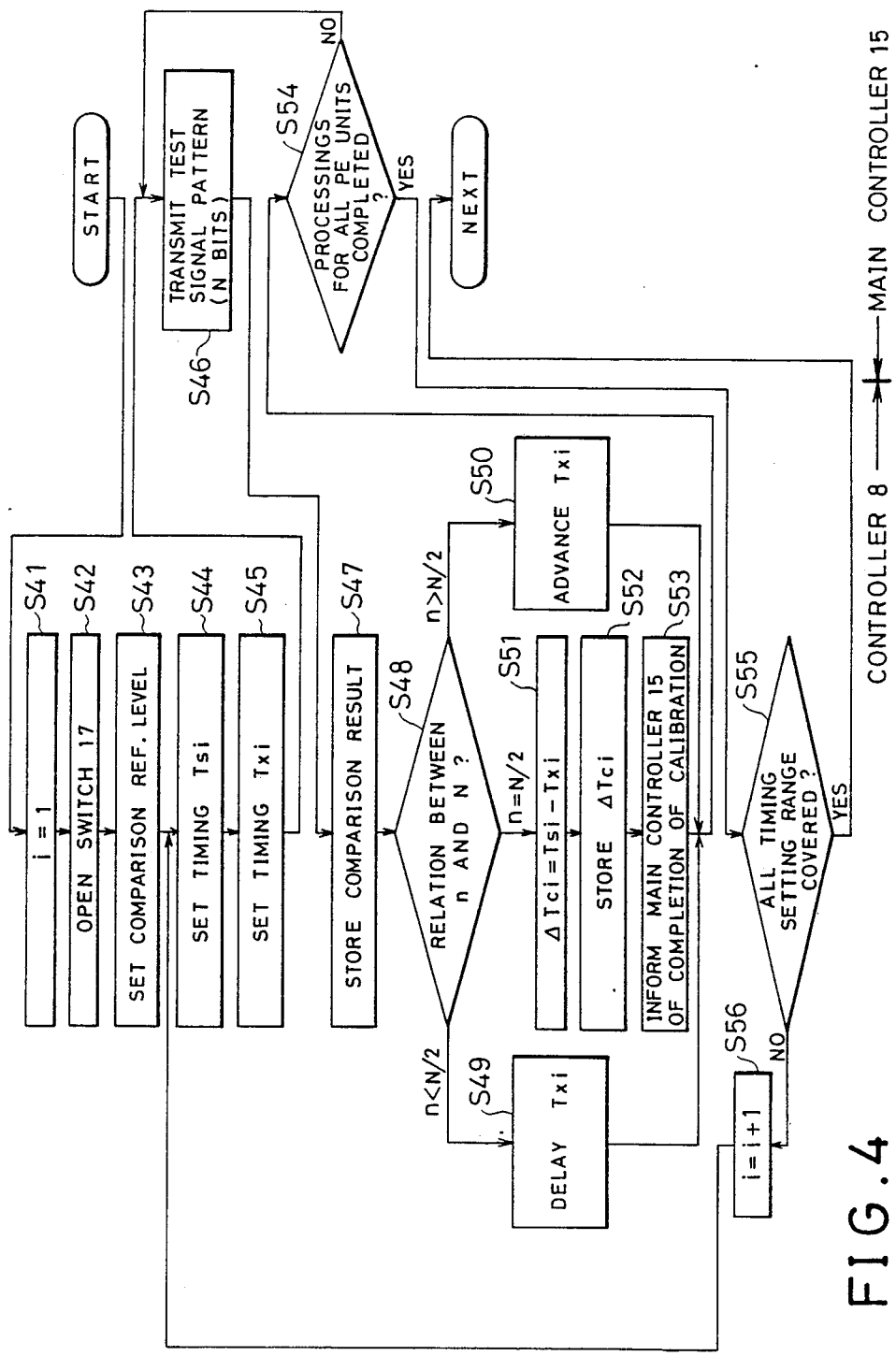

FIGS. 2, 3 and 4 show examples of a control procedure in the case of the calibration of the timing edge signal 2e, a control procedure in the case of the calibration of the length of a line connecting the pin electronics unit 9-i and the IC dvice 1 under test and a control procedure in the case of the calibration of the timing edge signals 2a-2d, by the controllers 8 and 15, respectively.

Referring now to FIG. 2, the control procedure in the case of the calibration of the timing edge signal 2e applied to the comparator 5 will be described in detail. First, in steps S1 and S2, a reference timing Tsi is set into the reference timing signal generator 11. Next, in each pin electronics unit 9-i, a timing Txi of the judging timing edge signal 2e which defines the operation timing of the comparator 5 is set under the control of the controller 8 in such a way that the timing Txi is equal to the preset timing Tsi of the output signal from the reference timing signal generator 11 (step S3). A voltage level for a comparison reference level is applied to one input terminal of the comparator 5 (step S4) and then the switch 18 is opened while the switches 16 and 17 are closed (step S5), so that the reference timing signal generator 11 is connected to all the pin electronics units 9-1, ..., 9-n to transmit N bits of the reference timing signal (step S6). In each pin electronics unit 9-i, the signal from the reference timing signal generator 11 which is simultaneously applied through the signal distributor 14 to the comparator 5 is detected at the timing defined by the judging timing edge signal 2e and the result of the detection is stored in the storage circuit 6 (step S7). In accordance with the result of the detection, an error $\Delta Tai = Tsi - Txi$ of the judging timing edge signal 2e with respect to the timing of the output signal from the reference timing signal generator 11; that is, the reference timing; can be obtained. The error is stored, for instance, in the storage circuit 6 (steps S8-S13).

That is, in step S8, the number n of times that the comparison result judged to be high level (or low level) is obtained and depending upon whether $n < N/2$, $n > N/2$ or $n = N/2$ (where n is the detected number and N is the number of all bits transmitted), step S9, S10 or S11 is selected. In step S9, the timing Txi is delayed. In step S10, the timing Txi is advanced. In step S11, the error $\Delta Tai$ is obtained. In next step S12, the error is stored in the storage circuit 6. Subsequently, in step S13, the completion of the calibration is informed to the main controller 15.

Following step S9, S10 or S13, the main controller 15 proceeds to step S14 in which it is judged whether or not the processings for all the pin electronics units 9-1, ..., 9-n are completed. If all the processings are not completed, the procedure returns to step S6 so as to transmit again the reference timing signal consisting of N bits so that steps S7-S13 are repeated. When it is judged that all the processings are completed in step S14, the control procedure advances to step S15 in which it is judged whether or not all the range of timing setting is covered. When the result of step S15 is affirmative, the calibration of the timing edge signal 2e is completed. On the other hand, when the result is negative, the control procedure returns through step S16 to step S2, so that the reference timing signal is set to another set value Tsi+1 and then steps S3-S15 are repeated.

Upon the completion of the calibration of the timing edge signal 2e, the control procedure for calibrating the length of a line connecting the pin electronics unit 9-i and the IC device 1 under test is entered as will be described in detail with reference to FIG. 3.

The IC device 1 under test is disconnected from the pins 1-1, ..., 1-n. In step S22, the switches 16, 17 and 18 are closed and then in step S23, the reference timing Ts is set. In step S24, the timing edge signal 2e is set at Txi and in step S25 a comparison reference level Vi is set in the comparator 5.

Next, in step S26, the reference timing signal consisting of N bits is applied to the comparator 5 and to all the pins 1-1, ..., 1-n from the reference timing signal generator 11. When i=1, the signal directly applied to the comparator 5 is compared with the comparison reference level Vi. When i=2, the reference timing signal which is applied to and reflected back at the end point of each signal line extending from each pin electronics unit 9-i to its corresponding pin 1-i is compared with the comparison reference level $V_2$ in the comparator 5 (steps S27-S35) to obtain the timings Tx1 and Tx2, so that the length of the signal line between the pin electronics unit 9-i and its corresponding pin 1-i is measured in terms of $Tb = (Tx2 - Tx1)/2$ (step S36). The difference $\Delta Tb = Tb - Tbo$ between the measured value Tb and the reference value Tbo is stored in, for instance, the storage circuit 6 as an offset value of the length of the signal line (steps S37 and S38).

In the case of the comparison, the comparison reference level Vi is varied in such a way that the comparison reference level V1 is set to, for instance, the intermediate level of the applied signal's first transition that occur when the reference timing signal directly reaches to the comparator 5 and that the comparison level V2 is set to, for instance, the intermediate level of the applied signal's second transition that occur when the reference timing signal which is reflected back from the end point of the pin 1-i and superposed on the direct reference timing signal reaches the comparator 5.

Referring next to FIG. 4, the control procedure for calibrating the timing edge signals 2a-2d for supplying a test pattern will be described. It is noted that only the calibration procedure for the signal 2a is shown in FIG. 4 and that the remaining signals 2b-2d can be calibrated by repeating the similar procedure.

First, the controller 8 mounted on the pin electronics unit 9-i controls the test unit group on the unit 9-i so as to open the switch 17, whereby the driver 4 is connected only to the comparator 5 (steps S41 and S42). By using as a reference timing the judging timing for the comparator 5 for which the timing error measurement is already completed, an output timing error of the test signal pattern from the driver 4 is measured. More particularly, after the comparison reference level is set in the comparator 5 in step S43 and the timing of the signal 2e is set at Tsi in step S44, the timing Txi of the timing edge signal 2a (2b, 2c or 2d) which defines the output timing of the test signal pattern is set at the timing that the waveform formatter circuit 3 should respond to the signal 2a in step S45. The timing Tsi of the judging timing edge signal 2e supplied to the comparator 5 is set at the same value as, for instance, the timing Txi of the timing edge signal 2a. Thereafter, in step S46, the driver 4 transmits the test signal pattern of N bits to the comparator 5. In steps S47-S56, in accordance with the result of the comparison of the N-bit test signal pattern made by the comparator 5 at the timing Tsi defined by the judging timing edge signal 2e, the difference $\Delta Tci = Tsi - Txi$ between the timing edge signal 2a and the judging timing edge signal 2e is obtained and stored in the storage circuit 6.

Similarly, the differences between the timing edge signals 2b-2d and the judging timing edge signal 2e are sequentially obtained and stored in the storage circuit 6.

The controllers 8 mounted on the respective pin electronics units 9-1, ..., 9-n, operate independently of and in parallel with each other, so that the respective pin electronics units 9-1, ..., 9-n can execute the above-described operations in parallel.

Upon the completion of the above-mentioned measurements, in each pin electronics unit 9-i, under the control of the controller 8, the error $\Delta Tai$ of the judging timing edge signal 2e stored in the storage circuit 6 (i=1, 2, 3, ..., n) is added to the offset $\Delta Tb$ of the length of the signal line and the sum is regarded as a true timing error $\Delta Tai'$ of the judging timing edge signal 2e. Subsequently, the true timing error $\Delta Tai'$ of the judging timing edge signal 2e itself is added to and the offset $\Delta Tb$ of the signal line length is substracted from the deviation $\Delta Tci$ of the test signal pattern generation timing edge signal 2a, 2b, 2c or 2d stored in the storage circuit 6 with respect to the judging timing edge signal 2e, so that a true timing error of the test signal pattern generation timing edge signal 2a, 2b, 2c or 2d can be obtained.

The true timing error thus obtained by the above-described procedure is contained as an offset in the value of the respective timing edge signals 2a, 2b, 2c, 2d and 2e to be set, so that timing error calibration can be realized. That is, the controller 8 adjusts the set values of the timing signal generator 2 in accordance with the timing errors of the timing edge signals 2a-2e obtained by the above-described timing error measurements, so that the timing error calibration can be realized.

The controller 8 in the pin electronics unit 9-i shown in FIG. 1 can be constructed by utilizing Intel 8086 Microprocessor (S. P. Morse et al., "The Intel 8086 Microprocessor", Computer, 11, 6, pp. 18-27, June 1978). As the timing signal generator 2, the circuit shown in FIGS. 2 or 3 disclosed in "ANALYSIS AND DEFINITION OF OVERALL TIMING ACCURACY IN VLSI TEST SYSTEM", by S. Sugamori et al., Proc. IEEE Int'l Test Conference, pp. 143-153, October 1981, can be used. Furthermore, as the waveform formatter circuit 3, the circuit shown in FIGS. 5 or 6 in the above-described article, "ANALYSIS AND DEFINITION OF OVERALL TIMING ACCURACY IN VLSI TEST SYSTEM"can be used. As the test pattern generator 7, the circuit disclosed and shown in FIG. 3 in "EFFECTIVE TEST PATTERN GENERATION FOR HIGH SPEED LOGIC LSI TESTING", by Y. Ichimiya et al. Dig. Tech. Papers IEEE Test Conference, pp. 377-381, October 1979, can be used.

Figure 5:
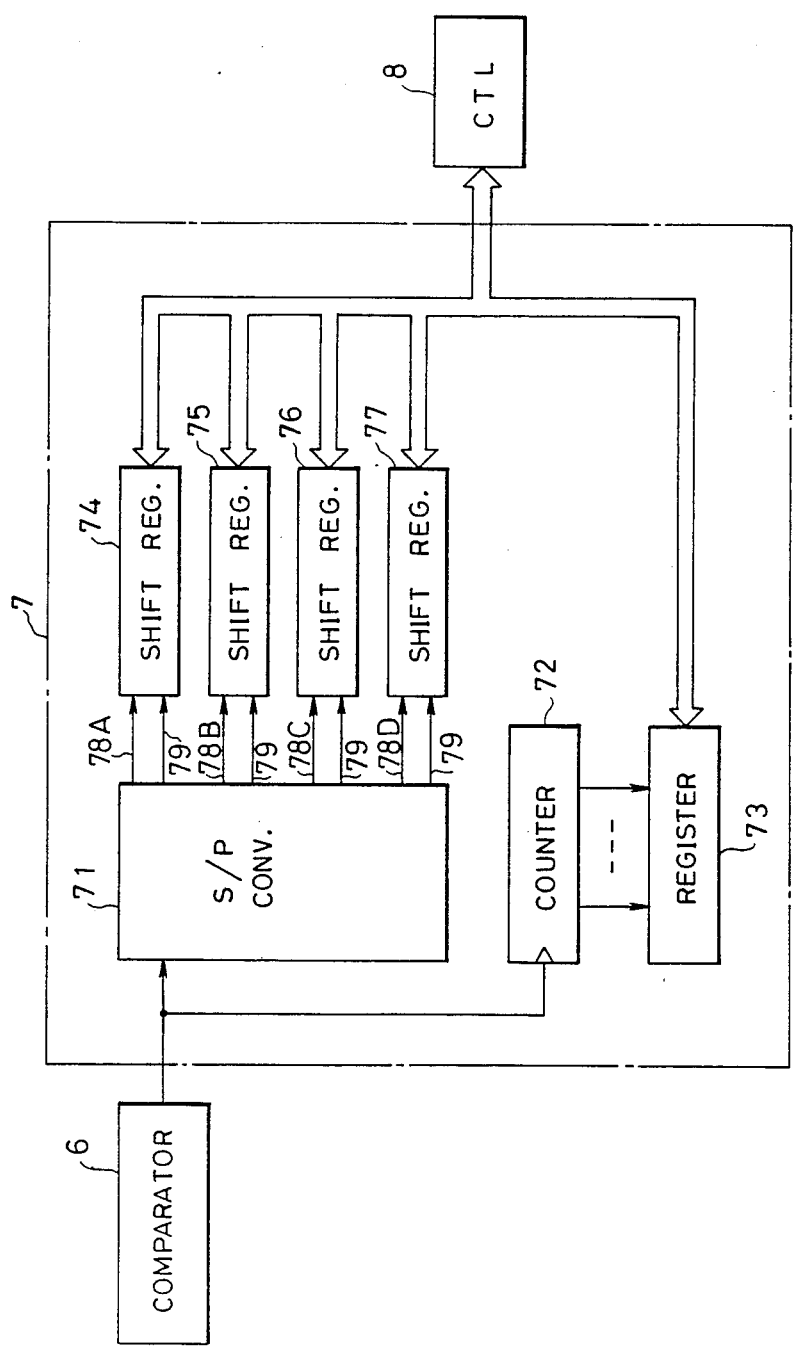
FIG. 5 is a block diagram showing a detailed example of a storage circuit of the embodiment shown in FIG. 1.

As the storage circuit 6 for storing therein the comparison results, a circuit shown in FIG. 5 can be used. Referring now to FIG. 5, reference numeral 71 represents a serial/parallel converter for converting the serial comparison result outputted from the comparator 6 into a parallel output. Reference numeral 72 denotes a counter receiving the comparison results outputted from the comparator 6 to count the number n of the times that the comparison result is judged to be high level (or low level). Reference numeral 73 denotes a buffer register for temporarily storing therein the number n from the counter 72. Parallel outputs 78A-78D from the serial/parallel converter 71 are supplied to four shift registers 74-77, respectively, which are driven by a $\frac{1}{4}$ frequency division clock 79. Under the control of the controller 8, the contents in the registers 74-77 are read out as the comparison results.

The signal distributor 14 can be arranged in the following manner. According to the present invention, the signal distributor 14 simultaneously supplies the signal from the reference timing signal generator 11 to all the pin electronics units 9-1, ..., 9-n. A variation in length of a signal line connecting the reference timing signal generator 11 and the pin electronics unit 9-i results also in a timing error, but such an error can be reduced to a minimum by arranging the signal distributor 14 in the following manner. The signal distributor 14 must distribute the reference timing signal to the plural test pins with remaining each signal amplitude substantially equal to that of a signal source.

Figure 6:
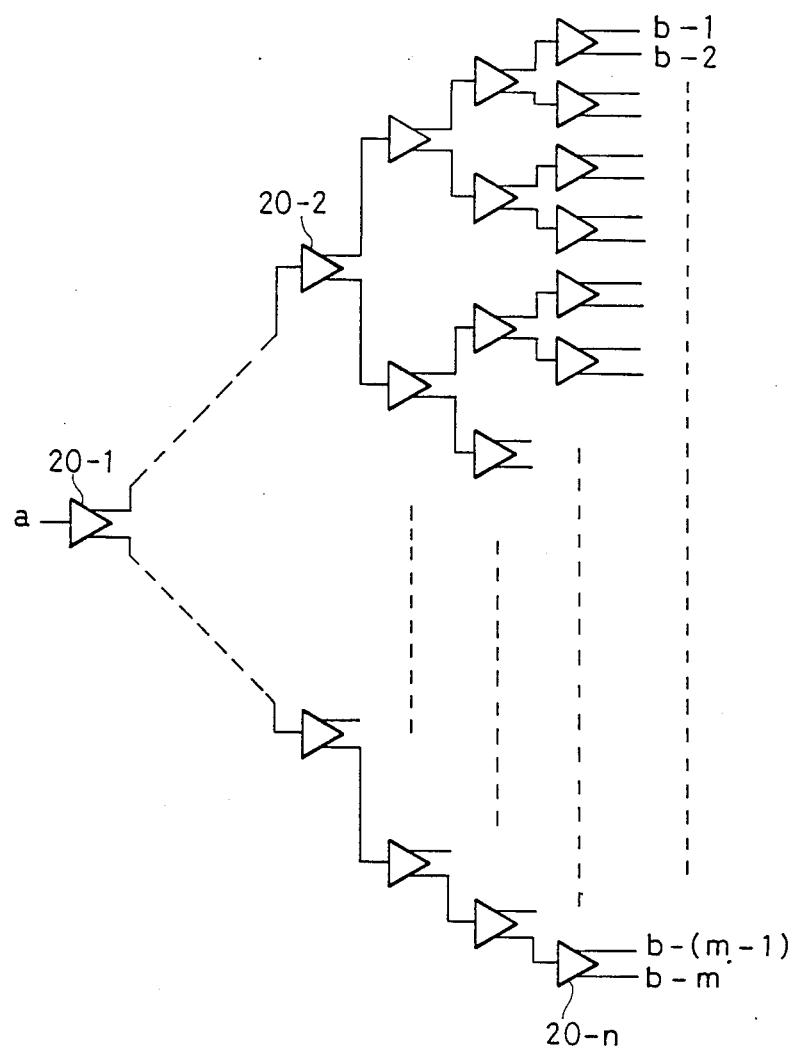
FIG. 6 is a block diagram showing a detailed example of a signal distributor of the embodiment shown in FIG. 1.

This can be realized by an embodiment of the signal distributor 14 in the present invention as shown in FIG. 6. In FIG. 6, a plurality of one-input/multi-output OR type logic gates 20-1, ..., 20-n are connected to each other in the form of a tree, so that one input a can be distributed into a plurality of outputs b-1, b-2, ..., b-(m-1), b-m. For instance, when an LSI such as a gate array with a gate delay time of the order of 100 ps is utilized to arrange a plurality of one-input/two-output logic gates as the logic gates 20-1, ..., 20-n, each signal line can be arranged by the series connection of 10 gate stages, even in the case of the signal distribution at the ratio of 1:1000. Therefore, if a layout is determined in such a way that the signal lines between the logic gates are equal in length to each other, variations in length of the respective signal lines can be limited to the order of 50 ps, even if variations in time delay in the logic gate and the time delay in the lines connecting the logic gates are as large as 5%. Overall timing accuracy guaranteed by the conventional LSI tester is not less than ±500 ps, so that from the standpoint of accuracy, the above-described variations in length of the signal lines can be neglected.

Figure 7:
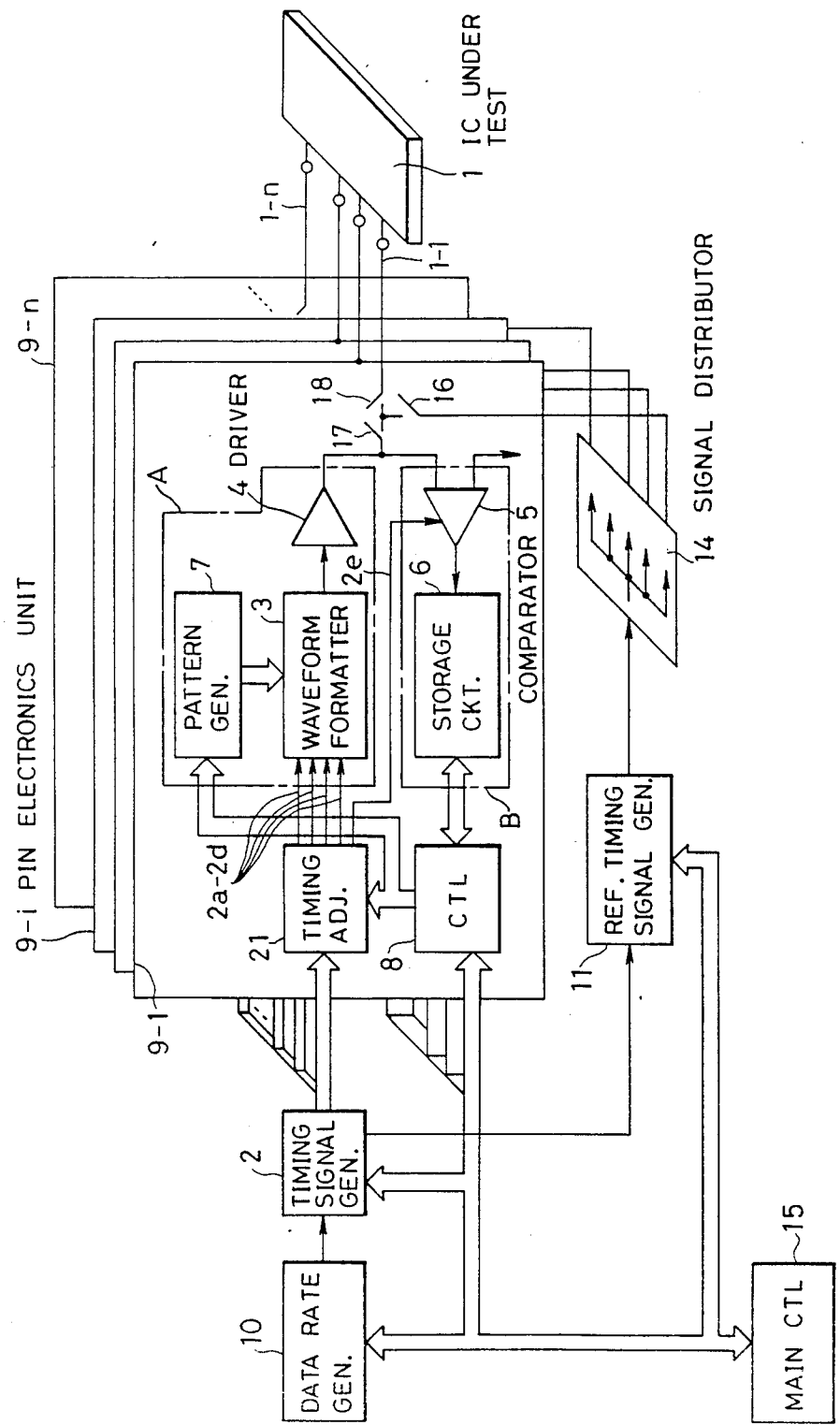
FIG. 7 is a block diagram showing another embodiment of the present invention.

The first embodiment of the present invention has been so far described as having one timing signal generator 2 for each pin electronics unit 9-i, but it is understood that one timing signal generator 2 can be shared in common by a plurality of pin electronics units 9-1, ..., 9-n. This embodiment is shown in FIG. 7. In this case, the timing calibration can be accomplished in a manner substantially similar to that described above by replacing the timing signal generator 2 shown in FIG. 1 by a timing adjustment circuit 21. The timing signal generator 2 is arranged in common between the data rate generator 10 and the timing adjustment circuits 21 in the respective pin electronics units 9-1, ..., 9-n.

In the case of the timing error measurements and the timing error calibrations, the processes executed by the controller 8 mounted on each pin electronics unit 9-i consist of simple arithmetic operations and loading of data into each test unit, so that it is sufficient to use a single one-chip microprocessor and there arises no problem form viewpoints of assembly and cost.

As decribed above, in the IC test system in accordance with the present invention, under the control of the plurality of controllers 8, each mounted on each pin electronics unit 9-i, the timing calibration processes can be executed in parallel by the respective controllers 8, so that the time required for executing the entire calibration process can be shortened to a fraction of the number of controllers used as compared with the conventional serial processing. When one controller 8 is mounted on each pin electronics unit 9-i, the timing calibration time can be shortened to a fraction of the number of test pins as compared with a time required for exectng a simple serial processing by the conventional IC test system.

Figure 8:
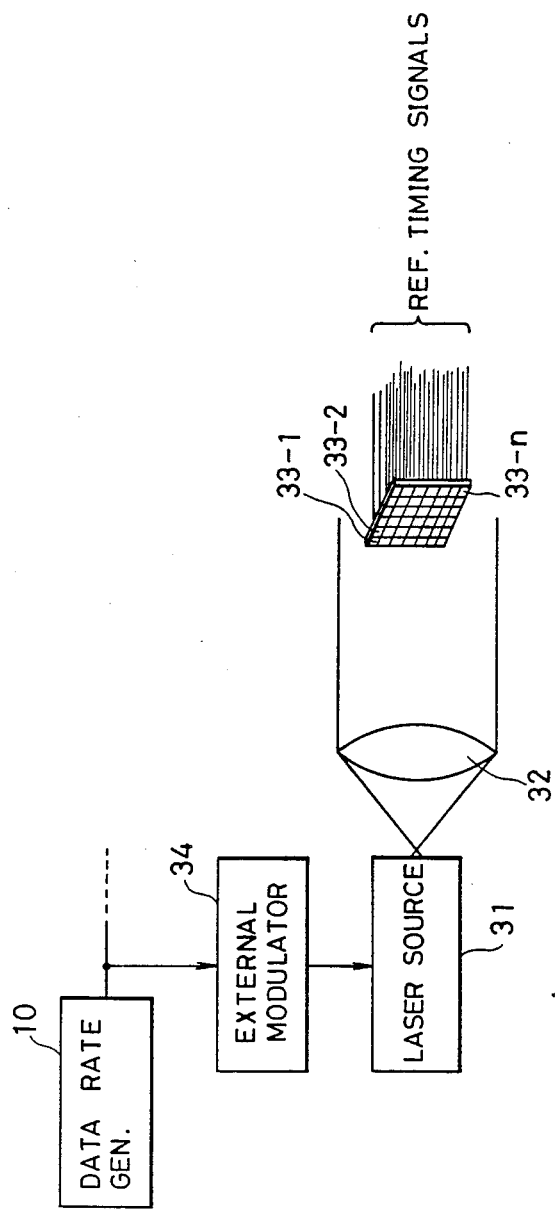
FIG. 8 is a block diagram showing another example of the signal distributor in the embodiment shown in FIG. 1.

The signal distributor 14 can be arranged to have a combination of, for instance, a laser source and a plurality of photo-electric conversion elements, as shown in FIG. 8. That is, the laser beam emitted from a laser source 31 is converted into a two-dimensional beam having a uniform intensity by a collimator 32. The collimated beam is projected uniformly at photoconductor elememts 33-1, ..., 33-n which arranged into an array so that they have the same optical length and the number of which is equal to the number of the test pins 1-l, ..., 1-n. The electric pulses obtained from the photoconductor elements 33-1, ..., 33-n by the photoelectic conversion are utilized as the above-described reference timing signals.

The laser source 31 can be externally modulated by an external modulator 34 in response to the electric signal clock pulse derived from the data rate generator 10, so that the laser source 31 can be synchronized with the clock frequency of the data rate generator 10. At present, a-Si or GaAs photodiodes having a super high response speed of the order of picoseconds are available as the photoconductor elements (for instance, "PICOSECOND OPTOELECTRONIC DEVICES", pp. 73-117, Academic Press, Inc. (1984) ). If they are used as the photoconductor elements 33-1, ..., 33-n and are arranged as shown in FIG. 8, the timing errors among the outputs from the signal distributor 14 can be reduced by one figure or more. Thus, the present invention can be used when it is desired to attain a timing accuracy of the order of 10 picoseconds.

Figure 9:
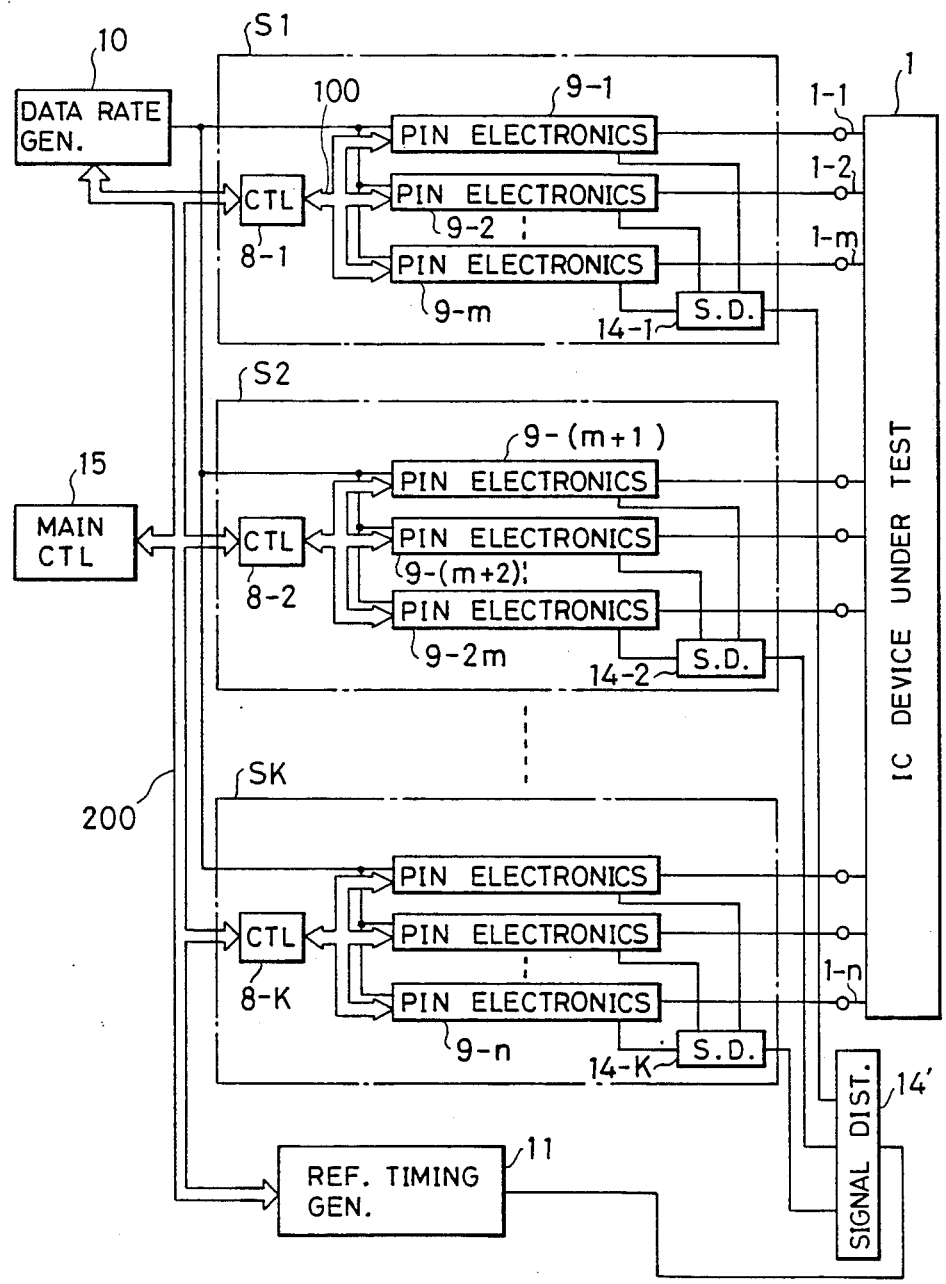
FIGS. 9 and 10 are block diagrams showing a further embodiment of the present invention.
Figure 10:
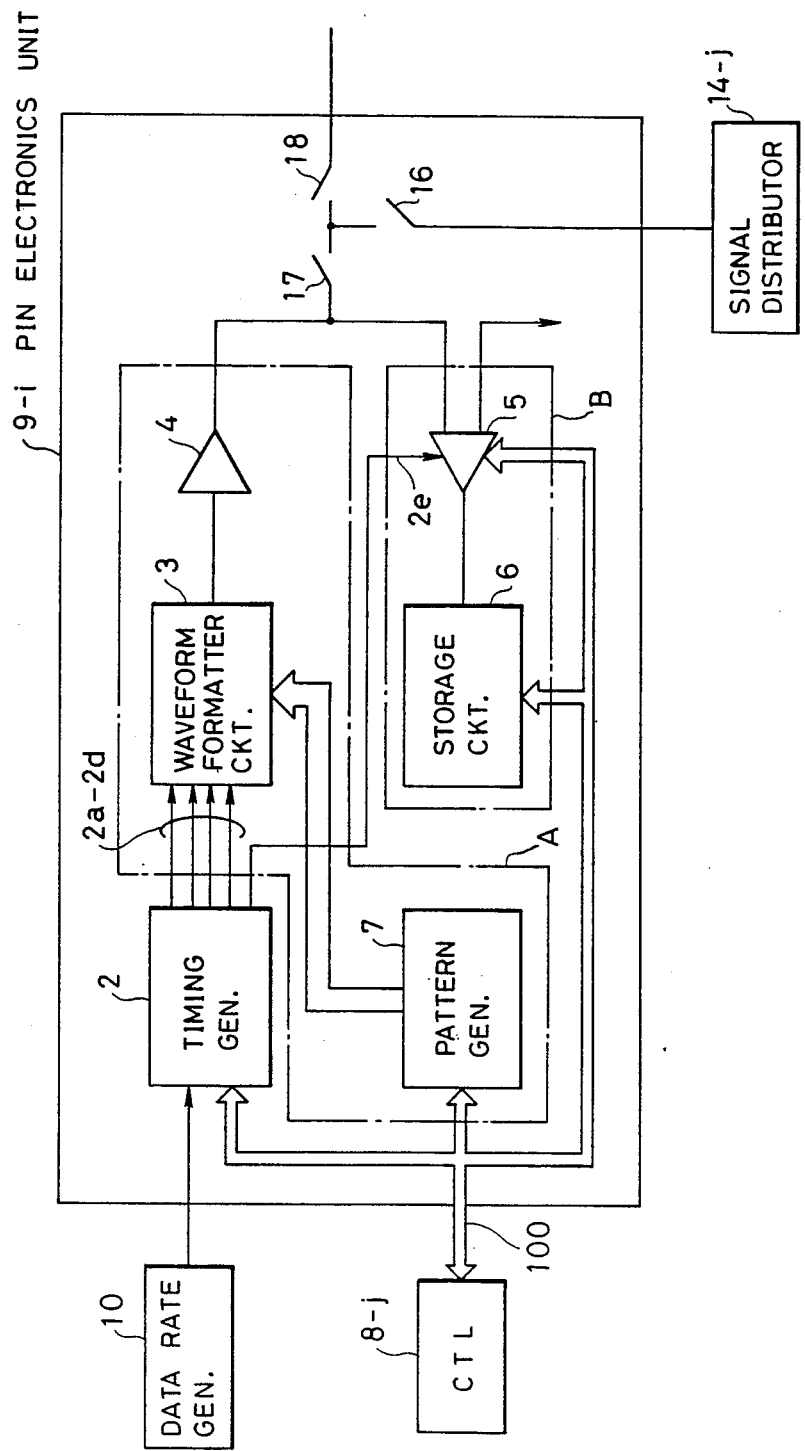

Referring next to FIG. 9, another embodiment of an IC test system in accordance with the present invention will be discribed. FIG. 10 shows an embodiment of the arrangement of a pin electronics unit of the IC test system.

There are provided n pin electronics units 9-1, ..., 9-n corresponding to n input/output pins 1-l, ..., 1-n of an IC device 1 under test, as shown in FIG. 9. As shown in FIG. 10, each pin elctronics unit 9-i (i=1, ..., n) fundamentally comprises a test pattern supply circuit A having a waveform formatter circuit 3, a pattern generator 7 and a driver 4; a test result judging circuit B having a comparator 5 and storage circuit 6 for storing therein the comparison results; a timing signal generator 2 for determining the operation timings of the test pattern supply circuit A and the test result judging circuit B, all of which constitute a test unit group; and a controller 8 for controlling the test unit group and executing the arithmetic operations thereof.

The n pin electronics units are divided into unit blocks Sj (j=1, 2, 3, ..., k), each of which has m pin electronics units and in which each one controller 8-j is connected through an intra-block bus 100 to the group of the test units within the block Sj.

In order to calibrate timing errors in the case of the generation of a test signal pattern of the judgement of the test results from an IC device under test, a reference timing signal generator 11 for defining a time reference in the case of timing error calibration is provided in common for all the pin electronics units 9-1, ..., 9-n. The output from the reference timing signal generator 11 is simultaneously supplied through a switch 16 arranged in each pin electronics unit 9-i (i=1, 2, 3, ..., n) to a group of signal lines by signal distributors 14' and 14-1, ..., 14-k, each extending from each pin electronics unit 9-i to its corresponding input/output pin 1-i (i=1, 2, 3, ..., n) of the IC device 1 under test through switches 17 and 18 arranged in eacch pin electronics unit 9-i.

A data rate generator 10 simultaneously distributes, to the generators 2 and 11, the clock signal for defining the generation of the test signal pattern required for testing the IC device 1, the period for judging the resultant response from the IC device 1 under test and the period for activating the reference timing signal generator 11. Furthermore, the controllers 8-1, ..., 8-k, the data rate generator 10 and the reference timing signal generator 11 are connected through a higher rank bus 200 to the main controller 15.

A test signal pattern is generated in a manner to be described in detail below. That is, the feed rate of the test signal pattern is determined by the clock frequency of the data rate generator 10. The timing that the waveform of the test signal pattern starts to rise and the timing that the waveform starts to fall at each period of the test signal pattern are determined by timing edge signals 2a-2d preset in the timing pulse generator 2 and used for wareform formatting. A mode and a level of the pattern in each period, such as a low level of RZ (Return to Zero) signal or high level of NRZ (Non-Return to Zero) signal are designated by the pattern generator 7 and in accordance with the pattern designation output data from the pattern generator 7, a test signal pattern to be actually used is generated by the waveform formatter circuit 3 at the timings determined by the timing edge signals 2a-2d. The test signal pattern generated is, thus, fed from the driver 4 through the switches 17 and 18 to the input pin of the IC device 1 under test which is connected to the pin electronics unit 9-i.

The result of the response of the IC device 1 under test to the input of the test signal pattern is judged as follows. That is, an expected level of the result of the response of the IC device 1 under test is set at one input terminal of thee comparator 5. In a simple manner, the expected level is set at the intermediate level of the expected output signal from the IC device 1 under test. The other input terminal of the comparator 5 is connected to the corresponding output pin of the IC device 1 under test through the switches 17 and 18. The signal levels of both the inputs are campared with each other at the output timing of the response-result judging timing edge signal 4e set in the timing pulse generator 2. The result of the comparison is stored in the storage circuit 6.

Due to variations in characteristics of the respective test units, lengths of lines connecting the test units, an ambient temperature of the system, a power supply voltage, and so on, the test signal pattern output timing edge signals 2a-2d and the timing edge signal 2e by which the result of the response of the IC device 1 under test is judged vary from one pin to another. Calibration of errors of such varied timing edge signals 2a-2e can be realized by adjusting the above-described signals for defining the test operation timings; that is, the timing edge signals 2a-2e generated by the timing generator 2 with respect to one time reference. A highly accurate signal source whose output delay time is calibrated already is used as the reference timing signal generator 11 which defines the time reference in the case of the timing error calibration.

Such timing error calibration is controlled both by the controller 8-j (j=1, 2, 3, ..., k) provided for each unit block Sj and by the main controller 15.

Figure 11:
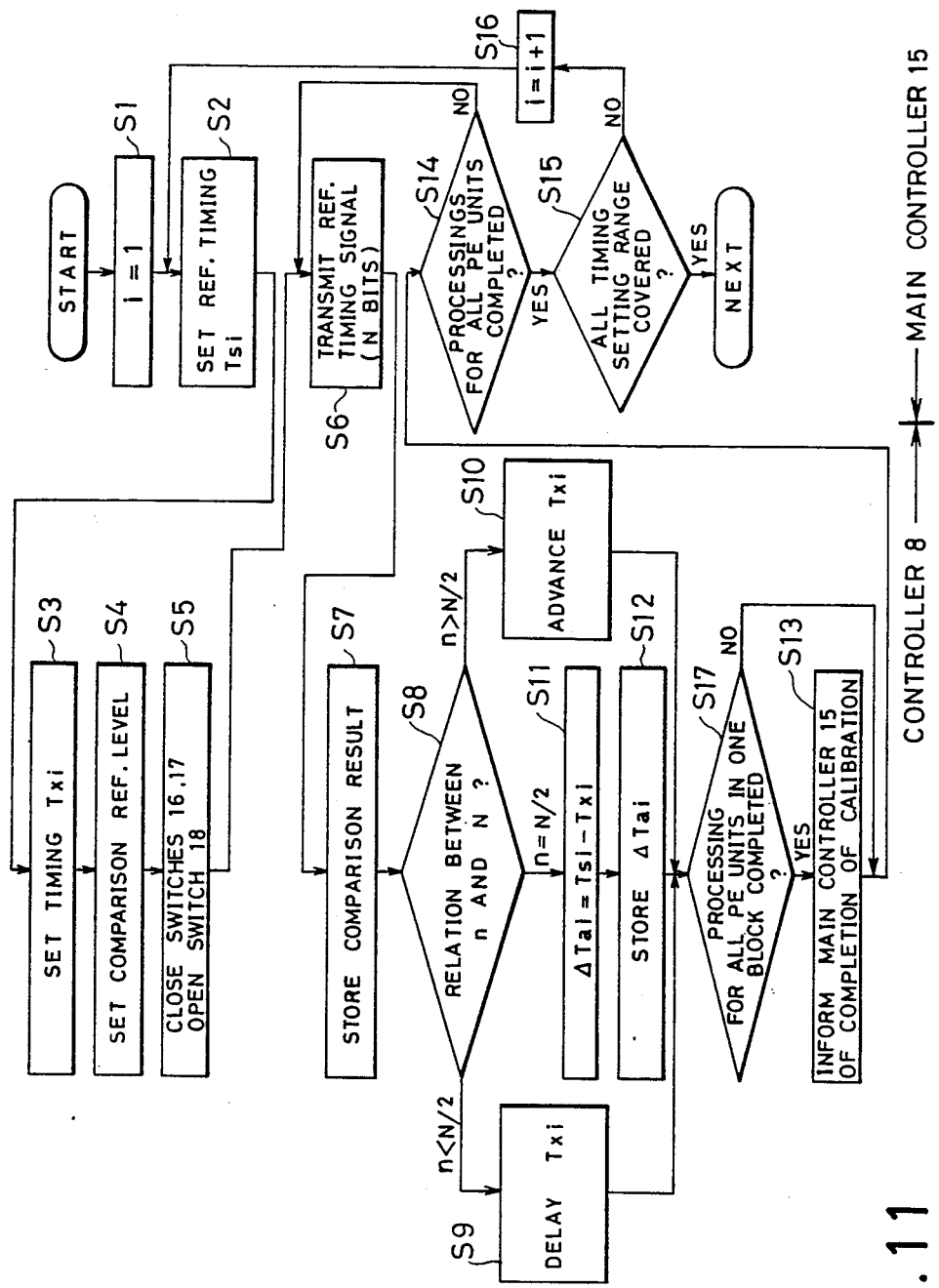
FIGS. 11, 12 and 13 are flowcharts illustrating examples of the control procedures thereof.
Figure 12:
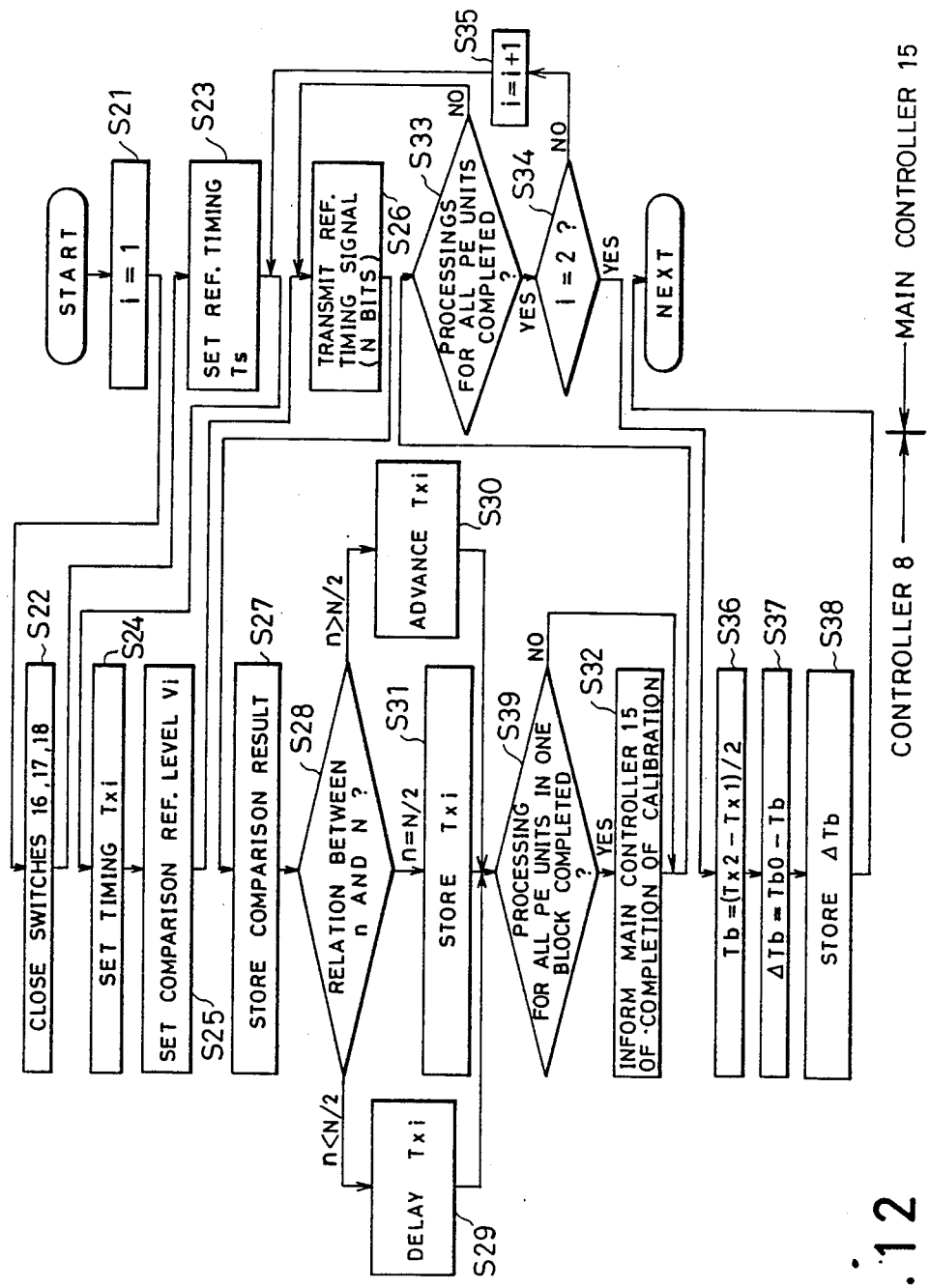
Figure 13:
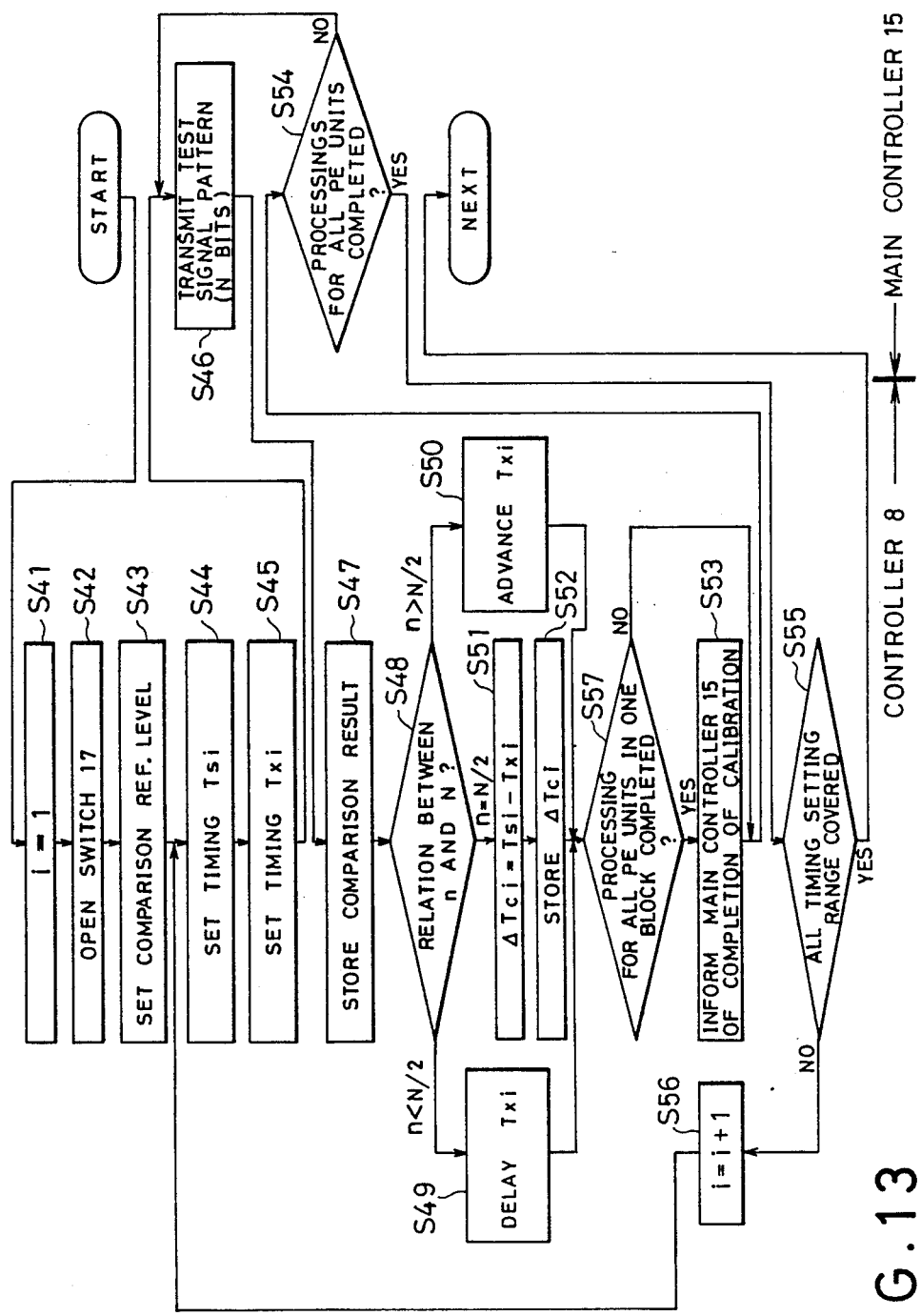

FIGS. 11, 12 and 13 show examples of a control procedure in the case of the calibration of the timing edge signal 2e, a control procedure in the case of the calibration of the length of a line connecting the pin electronics unit 9-i and the IC device 1 under test and a control procedure in the case of the calibration of the timing edge signals 2a-2d, by the controllers 8 and 15, respectively.

Referring now to FIG. 11, the control procedure in the case of the calibration of the timing edge signal 2e applied to the comparator 5 will be described in detail. First, in steps S1 and S2, a reference timing Tsi is set into the reference timing signal generator 11. Subsequently, in each pin electronics unit 9-i, under the control of the block controller 8-j assigned to each block Sj, the timing setting value Txi of the judging timing edge signal 2e which defines the operation timing of the comparator 5 is set to be equal to the timing setting value Tsi of the output signal from the reference timing signal generator 11 (step S3). In next step S4, the comparison reference voltage of the comparator 5 is set at a voltage level to be compared (for instance, an intermediate level of the input signal) and then in step S5, the switch 18 is opened, while the switches 16 and 17 are closed, so that the reference timing signal generator 11 is connected to all the pin electronics units 9-1, ..., 9-n. In this way, the timing error calibration process is ready to be executed. Steps S3-S5 are repeated plural times, the number of which is equal to the number of pin electronics units within the block Sj.

In step S6, in response to the N-bit reference timing signal Tsi supplied through the signal distributors 14' and 14-j to the respective comparators 5 in all the pin electronics units 9-1, ..., 9-n, the error calibration of the timing edge singal 2e for judging the test result is initiated. By setting the timing of the edge signal 2e to be ajusted at a given value Txi and by scanning the reference timing TSi from the reference timing signal generator 11 in the vicinity of the set timing Txi of the timing edge signal 2e to be adjusted (steps S15 and S16), the comparator 5 detects the timing at which Tsi and Txi coincide with each other. This detected timing is stored as a skew zero point timing (step S7) in the storage circuit 6. The error ΔTai of the test result judging timing edge signal 2e is obtained by the difference between the skew zero point timing Tsi and the set timing Txi of the timing edge signal to be adjusted and is stored in, for instance, the storage circuit 6 as an offset value (steps S8-S13).

Here, steps S8-S12 for setting the offset value are repeated plural times, the number of which is equal to the number of pin electronics units within each block Sj.

In step S17 subsequent to step S12, it is judged whether or not the offset values ΔTai data for all the pin electronics units within the block Sj are stored in the storage circuit 6. When the judgement result is affirmative, the procedure advances to step S13, in which the completion of the calibration is informed to the main controller 15. On the other hand, if the judgement result is negative, the procedure advances to step S16 via steps S14 and S15, so that i is incremended by one. Thereafter, the program returns to step S2.

Upon the completion of the calibration of the timing edge signal 2e, the control procedure for calibrating the length of a line connecting the pin electronics unit 9-i and the IC device 1 under test is entered as will be described in detail with reference to FIG. 12.

The IC device 1 under test is disconnected from the pins 1-1, ..., 1-n. In step S22, the switches 16, 17 and 18 are closed and then in step S23, the reference timing Ts is set. In step S24, the timing edge signal 2e is set at Txi and in step S25 a comparison reference level Vi is set in the comparator 5.

Next, in step S26, the reference timing signal consisting of N bits is applied to the comparator 5 and to all the pins 1-1, ..., 1-n from the reference timing signal generator 11. When i=1, the signal directly applied to the comparator 5 is compared with the comparison reference level Vi. When i=2, the reference timing signal which is applied to and reflected back at the end point of each signal line extendng from each pin eletronics unit 9-i to its corresponding pin 1-i is compared with the comparison reference level $V_2$ in the comparator 5 (steps S27-S35). The stepwise deviations in time of the leading and trailing edge portions of the input waveform resulting from the reflection can be obatained from the timing difference Tb at the skew zero point detected by scanning the test result judging timing edge, when the voltage V2 applied to the comparator 5 is determined at, for instance, ¼ and ¾ of the input signal level (steps S27-S35). This timing difference Tb is equal to a transmission delay time when the signal transmits to and from the end point of the signal line. Accordingly, following the above-mentioned procedure, the length of the signal line between the pin electronics unit 9-i and the pin 1-i can be measured as Tb (step S36) and the difference between the measured value and the reference value is stored in, for instance, the storage circuit 6 as an offset value of the signal line length (steps S37 and S38).

The flowchart shown in FIG. 12 is substantially similar to the flowchart shown in FIG. 3, but in FIG. 12, step S22, steps S24 and S25, steps S28-S31 and steps S36-S38 are repeated plural times, the number of which is equal to the number of the pin electronics units within each block Sj. After step S31, the procedure goes to step S39. In step S39, it is judged whether or not Txi data for all the pin electronics units within the block Sj are stored in the storage circuit 6. When the judgement is affirmative, the procedure advances to step S32 so as to inform the completion of the calibration to the main controller 15. On the other hand, when the judgement is negative, the procedure advances to step S35 through steps S33 and S34, so that i is incremented by 1. Thereafter, the procedure returns to step S24.

Next, the test result judging timing edge signal 2e for which the timing error measurement was completed is used as a reference timing so as to sequentially measure errors of the test pattern supply timing edge signals 2a-2d. The calibration control procedure for this error measurement will be described with reference to FIG. 13. In FIG. 13, only the procedure for the timing edge signal 2a is shown, but it is understood that the calibration procedures for the remaining signals 2b-2d are carried out by repeating the procedure similar to that for the timing edge signal 2a.

In this case, the controller 8-j assigned to the block Sj controls the group of test units on each pin electronics unit 9-i within the block Sj, so that the switch 17 is opened and consequently the driver 4 is connected only to the comparator 5 (steps S41 and S42). In step S43, the comparison reference level of the comparator 5 is set and in step S44, the timing Tsi of the signal 2e is set. In step S45, the timing of the timing edge signal 2a is set at a given value Txi. In steps S46-S56, by scanning the timing Tsi of the test result judging edge signal 2e, the comparator 5 obtains a skew zero point of both the timings Txi and Tsi. The error of the test pattern supply timing edge is obtained as the difference $\Delta$Tci between the zero point timing Tsi and the set timing Txi of the timing edge signal to be adjusted and is stored in, for instance, the storage circuit 6 (step S52).

The flowchart shown in FIG. 13 is substantially similar to the flowchart shown in FIG. 4, except that steps S42-S45 and steps S48-S52 are repeated plural times, the number of which is equal to the number of the pin electronics units in the block Sj. In step S57 following step S52, it is judged whether or not $\Delta$Tci data for all the pin electronics units within the block Sj are stored in the storage circuit 6. When the judgement is affirmative, the procedure advances to step S53, informing the completion of the calibration to the main controller 15. On the other hand, when the judgement is negative, the procedure advancess through step S54 to step S46. IIn step S46, the N-bit reference timing signal is transmitted and thereafter the procedure from step S47 to step S53 is repeated. Next, in step S54, it is judged whether or not the processing for all the pin electronics units 9-1, . . . , 9-n is completed. If the judgement is affirmative, the procedure goes to step S55. In step S55, it is judged whether or not all the range of the timing setting is covered. If the judgement is negative, the procedure advances to step S56. In step S56, i is incremented by one. Thereafter, the procedure returns to step S44. On the other hand, if the judgement is step S55 is affirmative, the entire procedure is completed.

In like manner, the differences between the timing edge signals 2b-2d and the judging timing edge signal 2e are sequentially measured and then stored in the storage circuit 6.

The controllers 8-1, 8-2, . . . , 8-k assigned to the blocks S1, S2, . . . , Sk, respectively, operate independently of and in parallel with each other, so that the above-described operations for the blocks S1, S2, . . . , Sk can be executed in parallel with each other.

Each timing error data thus obtained is defined as an offset which is substrated from the set timing data, so that the timing free from an error can be generated. For instance, in the case of setting the timings of the test pattern supply edge signal 2a-2d, it is sufficient to select the edge output timing in such a manner that the timing is generated by subtracting the errors $\Delta$Tci and $\Delta$Tai of the edges and by adding the error $\Delta$Tb of the length of the signal line between the pin electronics unit 9-i and the pin 1-i from the set timing value. Furthermore, in the case of setting the test result judging timing edge, it is sufficient to select the output timing of the edge in such a manner that the timing is generated by subtracting the error $\Delta$Ta of the edge and the error $\Delta$Tb of the length of the signal line between the pin electronics unit 9-i and the pin 1-i from the set timing value.

In the case of the detection of the skew zero point of the test result judging timing edge, the following procedures are repeated as is apparent from the flowcharts shown in FIGS. 11-13.

That is, (1) the procedure for setting the timing of the reference timing edge signal; (2) the procedure for setting the timing of the timing edge signal to be adjusted; (3) the procedure for outputting the N-bit pattern; (4) the procedure for storing the response results from the comparator 5; (5) the procedure for reading out the response results; (6) the procedure for judging the skew zero of the response results; (7) the procedure for changing the timing of the reference timing edge signal; (8) the procedure for calculating a timing error; and (9) the procedure for storing the timing error are repeated. However, the measurement of the length of the signal line between the pin electronics unit 9-i and the test pin 1-i does not require the procedure (2).

In the case of the measurement of the error of the test result judging timing edge signal, the output from the reference timing signal generator 11 is used as the reference timing edge signal. It follows, therefore, that in the above-described procedures (1), (3), (4) and (7), the parallel processing can be executed in parallel among the plural test pins, while the procedures (2), (5), (6), (8) and (9) which are controlled by the controller 8 are executed in parallel among th blocks.

Meanwhile, in the case of the measurements of the error of the length of the signal line between the pin electronics unit 9-i and the test pin 1-i and the error of the test pattern supply timing edge signal, the test result judging timing edge signal is used as a reference timing edge signal, so that the procedures (1) and (7) are executed in parallel among the blocks.

The rise and fall of the edge signal to be adjusted and the rise and fall of the reference timing edge signal are accompanied with dynamic fluctuations due to jitter or the like, so that the determination of the skew zero poiint is made as follows. That is, when the skew zero point is judged, the timing signal pattern generally having a length from few K bits to hundreds K bits is applied to the comparator 5. When the number of bits that the output from the comparator 5 is the low or high level reaches the vicinity of 50% of the number of input bits, the skew zero point is determined. For instance, when the length of the reference signal pattern is 10K bits in an IC tester with the operation rate of 100 MHz, the time required for executing the procedure (3) becomes 100 $\mu$s. When the main controller 15 and the controller 8 are microprocessors and when the clock rates of both the main controller 15 and the controller 8 are set at 10 MHz, the time required for processing one instruction is of the order from 0.5 to 1 $\mu$s. Of the parallel executions of the procedures (1), (3), (4) and (7) among the test pins, the procedures (1), (4) and (7) controlled by the controller 8 or 15 can be executed by six instructions at most. Therefore, almost all the time required for executing the parallel operations among the test pins is occupied by the time required for transmitting the reference signal pattern and is estimated to be about 100 $\mu$s. About 15 instructions per pin are required for parallel executions of the procedures (1), (2), (5), (6), (7), (8) and (9), so that the processing time under the above-described conditions is estimated to be about 7.5-15 $\mu$s.

When the number of pins in each block in m, the time required for comparing one timing set value of one timing edge for all the pins with the reference timing to obtain the skew zero point is of the order of (100+15 m) $\mu$s. For instance, when the number of pins per block is in the range from 4 to 16, the processing time is of the order of 160-340 $\mu$s. In the case of a simple serial processing, the processing time becomes the product of the number of pins and the above-mentioned processing time per pin (100+15) $\mu$s. For instance, in the case of a conventional multi-pin IC tester having 200-500 pins, the processing time becomes 20-60 ms. In contrast, according to the present invention, the procedures can be executed at a speed higher by 70-170 times than the conventional tester.

While in the second embodiment, the timing generator 2 is provided for each pin electronics unit 9-i, the timing generator 2 shown in FIG. 10 can be replaced by the timing adjustment circuit 21 as shown in FIG. 7, when one timing generator 2 is shared by all the pin electronics units 9-1, ..., 9-n. In this case, the timing calibration can be realized in a manner substantially similar to that described above, by executing the above-described procedures.

As described above, it is sufficient that the controller 8 has the capability of executing simple processing such as data transmission, arithmetic operations of data, comparison and so on, so that a one-chip microprocessor such as 8- or 16-bit microprocessor commercially available at an inexpensive price can be satisfactorily used as the controller 8.

As described above, the IC test system in accordance with the present invention has the function of simultaneously distributing and supplying the reference timing signal to the whole pin electronics units and the fuction of the group of controllers each provided for each block as a unit, so that almost all the timing calibration processing can executed in parallel. As a result, the time required for executing the timing calibration can be considerably shortened as compared with the conventional serial processing. For instance, according to the present invention, in the case of a tester with 200-500 pins which are divided into plural blocks, to each of which 4-16 pins are assigned, the processing time can be shortened to about 1/70-1/170.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications fall within the true spirit of the invention.

What is claimed is:

1. An IC test system for testing an IC device by supplying a test signal pattern to said IC device through the input/output pins of said IC device and by receiving output signals froms aid IC device through said input/output pins, comprising:
  (A) clock means for generating clocks;
  (B) a main controller for controlling said IC test system;
  (C) a plurality of pin electronics units, each of which is assigned to each of said input/output pins, each pin electronics unit having;
  (C1) timing signal generating means for generating, in response to the clocks from said clock means, first timing signals for providing timings for supplying said test signal pattern to said IC device and a second timing signal for providing a timing for judging test result of said IC device;
  (C2) pattern generating means for generating said test signals pattern in accordance with the timings defined by said first timing signals;
  (C3) test result judging means receiving said test signal pattern and responses of said IC device to said test signal pattern and for judging the result of said responses at the timing of said second timing signal; and
  (C4) a controller for cooperating with said timing signal generating means, said pattern generating means said test result judging means to measure errors of said first and second timing signals and an error of the length of a line between each pin electronics unit and its corresponding input/output pin and for performing arithmetic operations of and controls of calibration of said errors;
  (D) reference timing signal generating means receiving the clock from said clock means and for generating a reference timing signal which defines a time reference when measuring said errors; and
  (E) distributing means for simultaneously distributing, in the case of said calibration of said errors, said reference timing signal to said test result judging means of all said pin electronics units or to said test result judging means of all said pin electronics units and the input/output pins corresponding to respective ones of said plurality of pin electronics units; said main controller controlling said clock means, said controller in each of said plurality of pin electronics units and said reference timing signal generating means to execute said calibration of said errors for said plurality of pin electronics units in parallel among said plurality of pin electronics units.

2. An IC test system as claimed in claim 1, wherein said pattern generating means includes a pattern generation circuit for storing therein pattern data for designating mode and level of said test signal pattern and a waveform formatter circuit receiving said first timing signals and said pattern data and for generating said test signal pattern.

3. An IC test system as claimed in clam 1, wherein said test result judging means includes a comparator for comparing said test signal pattern and said response to said test signal pattern with a comparison reference level at a timing of said second timing signal and a storage circuit for storing comparison results from said comparator.

4. An IC test system as claimed in claim 1, wherein said distributing means comprises a plurality of one-input/multi-output OR logic gates connected in the form of tree.

5. An IC test system as claimed in claim 1, wherein each of said pin electronics units includes a first switch having one terminal connected to said distributing means, a second switch having one terminal connected to said test result judging means and a third switch having one terminal connected to each of said input/output pins and the other terminals of said first, second and third switches are connected in common.

6. An IC test system as claimed in claim 1, wherein said pattern generating means includes a driver circuits for supplying said test signal pattern to said test result judging means.

7. An IC test system for testing an IC device by supplying a test signal pattern to said IC device through the input/output pins of said IC device and by receiving output signals from said IC device through said input/output pins, comprising:
  (A) clock means for generating clocks;
  (B) a main controller for controlling said IC test system;
  (C) a plurality of pin electronics units, each of which is assigned to each of said input/output pins, each pin electronics unit having;
  (C) timing signal generating means for generating, in response to the clocks from said clock means, first timing signals for providing timings for supplying said test signal pattern to said IC device and a second timing signal for providing a timing for judging test result of said IC device;
(C2) pattern generating means for generating said test signal pattern in accordance with the timings defined by said first timing signals; and
(C3) test result judging means receiving said test signal pattern and responses of said IC device to said test signal pattern and for judging the result of said responses at the timing of said second timing signal;
(D) a plurality of controllers, each assigned to each one of a plurality of blocks, each of which has a plurality of pin electronics units and for cooperating with said main controller, said timing signal generating means, said pattern generating means and said test result judging means to measure errors of said first and second timing signals and an error of the length of line between each pin electronics unit and its corresponding input/output pin and for performing arithmetic operations of and controls of calibration of said errors;
(E) reference timing signal generating means receiving the clocks from said clock means and for generating a reference timng signal which defines a time reference when measuring said errors; and
(F) distributing means for simultaneously distributing, in the case of said calibration of said errors, said reference timing signal to said test result judging means of all said pin electronics units in said plurality of blocks or to said test result judging means of all said pin electronics units in said plirality of blocks and said input/output pins corresponding to respective ones of said plurality of blocks; said main controller controlling said clock means, said plurality of controllers and said reference timing signal generating means to execute said calibration of said errors for said plurality of pin electronics units in series with respect to said plurality of electronics units in each block and in parallel among said plurality of blocks.

8. An IC tests system as claimed in claim 7, wherein said pattern generating means includes a pattern generation circuit for storing therein pattern data for designating mode and level of said test signal pattern and a waveform formatter circuit receiving said first timing signals and said pattern data and for generating said test signal pattern.

9. An IC test system as claimed in claim 7, wherein said test result judgiing means includes a comparator for comparing said test signal pattern and said response to said test signal pattern with a comparison reference level at a timing of said second timing signal and a storage circuit for storing comparison results from said comparator.

10. An IC test system as claimed in claim 7, wherein said distributing means includes first distributing means provided in common to all of said plurality of blocks and a plurality of second distributing means, each provided in common to said plurality of pin electronics units in each of said plurality of blocks.

11. An IC test system as claimed in claim 10, wherein each of said first and second distributing means includes a plurality of one-input/multi-output OR logic gates connected in the form of tree.

12. An IC test system as claimed in claim 7, wherein said distributing means includes a plurality of one-input/multi-output OR logic gates connected in the form of tree.

13. An IC test system as claimed in claim 7, wherein each of said pin electronics units includes a first switch having one terminal connected to said distributing means, a second switch having one terminal connected to said test result judging means, a third switch having one terminal connected to each of said input/output pins and the other terminals of said first, second and third switches are connected in common.

14. An IC test system as claimed in claim 7 wherein said pattern generating means includes a driver circuit for supplying said test signal pattern to said test result judging means.

15. An IC test system for testing an IC device by supplying a test signal pattern to said IC device through the input/output pins of said IC device and by receiving output signals from said IC device through said input/output pins, comprising:
(A) clock means for generating clocks;
(B) a main controller for controlling said IC test system;
(C) a plurality of timing generating means, each assigned to each of said input/output pins, and each responsive to the clocks from said clock means for generating first timing signals for providing timings for supplying said second timing signal for providing a timing for judging test result of said IC device;
(D) a plurality of pattern generating means, each assigned to each of said input/output pins, and each for generating said test signal pattern in accordance with the timings defined by said first timing signals;
(E) a plurality of test result judging means, each assigned to each of said input/output pins, and each responsive to said test signal pattern and to responses of said IC device to said test signal pattern for judging the result of said responses at the timing of said second timing signal;
(F) a plurality of controllers, each cooperating with said main controller, said timig signal generating means, said pattern generating means and said test result judging means to measure errors of said first and second timing signals and an error of the length of a line between said IC test system and each of said input/output pins for performing arithmetic operations of and controls of said calibration of said errors;
(G) reference timing signal generating means receiving the clocks from said clock means and for generating a reference timing signal which defines a time reference when measuring said errors; and
(H) distributing means for simultaneously distributing, in the case of said calibration of said errors, said reference timing signal to said plurality of test result judging means or to said plurality of test result judging means and all of said input/output pins; said main controller controlling said clock means; said plurality of controllers and said reference timing signal generating means to execute said calibration of said errors in parallel among said plurality of controllers.

16. As IC test system as claimed in claim 15, wherein said pattern generating means includes a pattern generation circuit for storing therein the pattern data for designating mode and level of said test signal pattern and waveform formatter circuit receiving said first timing signals and said pattern data and for generating said test signal pattern.

17. An IC test system as claimed in claim 15, wherein said test result judging mean includes a comparator for comparing said test signal pattern and said response to said test signal pattern with a comparison reference level at a timing of said second timing signal and a storage circuit of storing comparison results from said comparator.

18. An IC test system as claimed in claim 15, wherein said distributing means includes a plurality of one-input/multi-output OR logic gates connected in the form of tree.

19. An IC test system as claimed in claim 15, wherein each of said pin electronics units includes a first switch having one terminal connnected to said distributing means, a second switch having one terminal connected to said test result judging means, a third switch having one terminal connected to each of said input/output pins and the other terminals of said first, second and third switch are connected in common.

20. An IC test system as claimed in claim 15, wherein said pattern generating means includes a driver circuit for supplying said test signal pattern to said test result judging means.

21. An IC test system for testing an IC device by supplying a test signal pattern to said IC device through the input/output pins of said IC device and by receiving output signals from said IC device through said input/output pins, comprising:

(a) clock means for generating clocks;

(B) a main controller for controlling said IC test system;

(C) common timing signal generating means for generating a common timing signal in response to the clock from said clock means;

(D) a plurality of timing adjusting means; each assigned to each of said input/output pins, and for adjusting timing of said common timing signal to generate first timing signals for providing timings for supplying said test signal pattern to said IC device and a second timing signal for providing a timing for judging test result of said IC device;

(E) a plurality of pattern generating means, each assigned to each of said input/output pins, and for generating said test signal pattern in accordance with the timings defined by said first timing signals;

(F) a plurality of test result judging means, each assigned to each of said input/output pins, and each responsive to said test signal pattern and to responses of said IC device to said test signal pattern for judging the result of said responses at the timing of said second timing signal;

(G) a plurality of controllers, each for cooperating with said main controller, said timing signal adjusting means, said pattern generating means and said test result judging means to measure errors of said first and second timing signals and an error of the length of a line between said IC test system and each of said input/output pins for performing arithmetic operations of and controls of said calibration of said errors;

(H) reference timing signal generating means receiving the clocks from said clock means and for generating a reference timing signal which defines a time reference when measuring said errors; and (I) distributing means for simultaneously distributing, in the case of said calibration of said errors, said reference timing signal to said plurality of test result judging means or to said plurality of test result judging means and all of said input/output pins; said main controller controlling said clock means, said common timing signal generating means, said plurality of controllers and said reference timing signal generating means to execute said calibration of said errors parallel among said plurality of controllers.

22. An IC test system as claimed in claim 21, wherein said pattern generation means includes a pattern generation circuit for storing therein pattern data for designating mode and level of said test signal pattern and a waveform formatter circuit receiving said first timing signals and said pattern data and for generating said test signal pattern.

23. An IC test system as claimed in claim 21, wherein said test result judging means includes a comparator for comparing said test signal pattern and said response to said test signal pattern with a comparison reference level at a timing of said second timing signal and a storage circuit for storing comparison results from said comparator.

24. An IC test system as claimed in claim 21, wherein said distributing means inclides a plurality of one-input/multi-output OR logic gates connected in the form of tree.

25. An IC test system as claimed in claim 21, wherein each of said pin electronics units includes a first switch having one terminal connected to said distributing means, a second switch having one terminal connected to said test result judging means, a third switch having one terminal connected to each of said input/output pins and the other terminals of said first, second and third switches are connected in common.

26. An IC test system as claimed in claim 21, wherein said pattern generating means includes a driver circuit for supplying said test signal pattern to said test result judging means.

* * * * *